US008344362B2

(12) United States Patent
Kitabayashi et al.

(10) Patent No.: US 8,344,362 B2
(45) Date of Patent: Jan. 1, 2013

(54) ORGANIC ELECTROLUMINESCENT DEVICE, METHOD FOR PRODUCING ORGANIC ELECTROLUMINESCENT DEVICE, AND ELECTRONIC APPARATUS

(75) Inventors: Atsushi Kitabayashi, Chino (JP); Masashi Goto, Chino (JP); Ryuhei Misawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 532 days.

(21) Appl. No.: 12/578,179

(22) Filed: Oct. 13, 2009

(65) Prior Publication Data

US 2010/0096988 A1 Apr. 22, 2010

(30) Foreign Application Priority Data

Oct. 17, 2008 (JP) ................................ 2008-268316
Jul. 22, 2009 (JP) ................................ 2009-170879

(51) Int. Cl.
*H01L 33/00* (2010.01)

(52) U.S. Cl. ......................................... 257/40; 438/158

(58) Field of Classification Search .................... 257/57, 257/59, 72, 359, E29.273, 40; 438/158
See application file for complete search history.

(56) References Cited

U.S. PATENT DOCUMENTS

| | | | | |
|---|---|---|---|---|
| 6,768,482 | B2 | 7/2004 | Asano et al. | |
| 2003/0054186 | A1 | 3/2003 | Miyashita et al. | |
| 2007/0205417 | A1* | 9/2007 | Ohara et al. | 257/79 |
| 2007/0215880 | A1* | 9/2007 | Sakata et al. | 257/79 |
| 2007/0222038 | A1* | 9/2007 | Moriwaka | 257/627 |
| 2007/0228380 | A1* | 10/2007 | Yoshinaga | 257/72 |
| 2007/0228382 | A1* | 10/2007 | Yamazaki et al. | 257/72 |
| 2007/0284627 | A1* | 12/2007 | Kimura | 257/257 |
| 2008/0029765 | A1* | 2/2008 | Yamazaki et al. | 257/67 |
| 2008/0090341 | A1* | 4/2008 | Tanaka et al. | 438/158 |
| 2008/0108206 | A1* | 5/2008 | Shimomura et al. | 438/481 |

FOREIGN PATENT DOCUMENTS

| | | |
|---|---|---|
| JP | A-10-153967 | 6/1998 |
| JP | A-2002-221917 | 8/2002 |
| JP | A-2006-244892 | 9/2006 |
| JP | A-2007-103032 | 4/2007 |
| JP | A-2007-227127 | 9/2007 |
| JP | A-2009-176457 | 8/2009 |

* cited by examiner

*Primary Examiner* — Nathan Ha
(74) *Attorney, Agent, or Firm* — Oliff & Berridge, PLC

(57) ABSTRACT

An organic EL device includes a base layer including a substrate, a partitioning portion disposed on the base layer and defining first and second film-formation regions adjacent to each other, a first organic EL element disposed on the base layer at a position overlapping the first film-formation region in plan view, a second organic EL element disposed on the base layer at a position overlapping the second film-formation region in plan view, a first drive circuit section disposed in the base layer to control driving of the first organic EL element, and a second drive circuit section disposed in the base layer to control driving of the second organic EL element. At least part of the first drive circuit section and at least part of the second drive circuit section overlap the first film-formation region in plan view.

19 Claims, 26 Drawing Sheets

10
27
19
18
17
16
15
14
1a
1
31
14a
23g
12
12c
12a
12d
12b
14b
14d
11c
11a
11d
11b
11
14d
13c
13b
13a
13
7a
7b
7c
20G
21
23g
24g
27
20B
21
23b
24b
27
20R
21
23r
24r
27
42
Lu 30
27
19
18
17
16
15
14
1a
1
31
12c
12a
12
12b
11c
11a
11
11b
13c
13b
13a
13
FILM-FORMATION REGION
24r
23r
21
42
Lu 41
41
12
11
14g
31c
11f
31c
14g
31
16a, 14a
11e
14f
14b
14d
14c
12f
1, 14
13c
14e
14h
13
13b, 1a
13a
42
14g
31c
14g
31c
31

50, 50R
50, 50B
50, 50G
60, 70R
60, 70B
60, 70G
23r
21
23b
21
23g
21
19
18
17
16
1
7c
7b
7a 200
20B
23b
25
24b
26b
27
20G
23g
25
24g
26g
26b
27
20R
23r
25
24r
26r
26b
27
21
21
21
Lu
27
26b
19
18
17
16
15
14
1a
1
31
12
11
13b
13
13a
7a
7b
7c
19
18
17
16
15
42
14
1a
1

ORGANIC ELECTROLUMINESCENT DEVICE, METHOD FOR PRODUCING ORGANIC ELECTROLUMINESCENT DEVICE, AND ELECTRONIC APPARATUS

BACKGROUND

1. Technical Field

The present invention relates to organic electroluminescent (EL) devices having light-emitting elements, methods for producing organic EL devices, and electronic apparatuses.

2. Related Art

A known organic EL device disclosed in JP-A-2007-103032 has functional layers including light-emitting layers in substantially rectangular aperture regions separated by partitions. The aperture regions have narrow portions formed by reducing the width between the long sides thereof at the center of the long sides in the lengthwise direction.

Another known organic EL device disclosed in JP-A-2007-227127 includes first partitions separating pixels of different colors and second partitions partially separating pixels of the same colors. Organic functional layers formed in adjacent pixels of the same colors are connected via regions where no second partitions are formed.

In the light-emitting devices disclosed in the above publications, the shape or arrangement of the partitions is modified so as to reduce variations in the thickness of the organic functional layers formed in the regions separated by the partitions. The light-emitting layers, included in the organic functional layers, are formed by ejecting liquid compositions containing light-emitting-layer forming materials by droplet ejection (ink-jet process) into the regions separated by the partitions and solidifying the compositions.

The light-emitting devices disclosed in the above publications are active-matrix devices in which light-emitting elements including organic functional layers are disposed on drive circuits on a substrate. The drive circuits each include at least two thin-film transistors (TFTs), a hold capacitor, and wiring lines connected thereto.

Because such electrical components are disposed on the substrate, the surface is not necessarily flat, but has steps, in the regions separated by the partitions. In particular, if the organic functional layers are formed by droplet ejection (ink-jet process), the ejected liquid compositions tend to flow into a step region at the lowest level and may therefore lead to uneven film thickness after drying.

SUMMARY

In the following aspects and embodiments of the invention, the terms "top" and "above" refer to a direction away from a substrate toward organic EL elements, and the term "on X" refers to being disposed on X in contact therewith, being disposed on X with another component therebetween, or being disposed on X partially in contact therewith and partially with another component therebetween.

An organic EL device according to a first aspect of the invention includes a base layer including a substrate, a partitioning portion disposed on the base layer and defining first and second film-formation regions adjacent to each other, a first organic EL element disposed on the base layer at a position overlapping the first film-formation region in plan view, a second organic EL element disposed on the base layer at a position overlapping the second film-formation region in plan view, a first drive circuit section disposed in the base layer to control driving of the first organic EL element, and a second drive circuit section disposed in the base layer to control driving of the second organic EL element. At least part of the first drive circuit section and at least part of the second drive circuit section overlap the first film-formation region in plan view.

The base layer, including the drive circuit sections of the organic EL elements, tends to have surface irregularities. In the above structure, however, the partitioning portion defines the first film-formation region such that at least parts of the drive circuit sections of at least two organic EL elements are disposed in the first film-formation region. This allows the base layer to have less surface irregularities in the second film-formation region than in the first film-formation region. Thus, the first and second film-formation regions have different levels (states) of surface irregularities. In the formation of the second organic EL element in the second film-formation region, therefore, at least a light-emitting layer is less affected by surface irregularities, so that it can be formed with reduced variations in thickness. Accordingly, at least the second organic EL element of the organic EL device can emit light with stable luminance.

In the above organic EL device, it is preferable that the first and second drive circuit sections each include a thin-film transistor and a hold capacitor, that the thin-film transistors of the first and second drive circuit sections be disposed at positions overlapping the first film-formation region in plan view, and that the hold capacitors of the first and second drive circuit sections be disposed at positions overlapping the second film-formation region in plan view.

In this case, the base layer has a higher surface flatness in the second film-formation region, where the hold capacitors are disposed, than in the first film-formation region, where the thin-film transistors are disposed. Accordingly, at least the light-emitting layer of the second organic EL element formed in the second film-formation region has reduced variations in thickness.

In addition, the design flexibility of the hold capacitors corresponding to at least two organic EL elements is improved as compared to the case where they are disposed in the first film-formation region together with the thin-film transistors.

In the above organic EL device, it is preferable that the first and second drive circuit sections each include a thin-film transistor and a hold capacitor and that the thin-film transistors and the hold capacitors of the first and second drive circuit sections be disposed at positions overlapping the first film-formation region in plan view.

In this case, the base layer has a still higher surface flatness in the second film-formation region because the thin-film transistors and the hold capacitors, which contribute to formation of surface irregularities, are disposed together in the first film-formation region. Accordingly, at least the light-emitting layer of the second organic EL element formed in the second film-formation region has further reduced variations in thickness.

In the above organic EL device, it is preferable that the first organic EL element include a first light-emitting layer formed by application and that the second organic EL element include a second light-emitting layer formed by application.

In this case, the partitioning portion defines the first film-formation region, where the first light-emitting layer is disposed, and the second film-formation region, where the second light-emitting layer is disposed, and the base layer has different levels of surface irregularities in the first and second film-formation regions. Accordingly, the first and second light-emitting layers can be formed with smaller variations in thickness than a single light-emitting layer formed by application so as to overlap the regions where the base layer has different levels of surface irregularities.

In the above organic EL device, it is preferable that the base layer have a higher surface irregularity in a region overlapping the first film-formation region in plan view than in a region overlapping the second film-formation region in plan view and that the first light-emitting layer have a longer emission life than the second light-emitting layer.

In this case, the first light-emitting layer, formed in the first film-formation region by application, tends to have larger variations in thickness than the second light-emitting layer, formed in the second film-formation region, because the first light-emitting layer is affected by the surface irregularity of the base layer. For the same type of light-emitting layer, one having larger variations in thickness tends to have a shorter emission life. Because the first light-emitting layer has a longer emission life than the second light-emitting layer, the difference in emission life between the first and second light-emitting layers is reduced. Accordingly, the organic EL device achieves a balance in emission life between the light-emitting layers.

The term "emission life" herein refers to the cumulative energization time elapsed after the initial luminance is decreased to a predetermined level (for example, halved) by continuous energization with, for example, the planar area and thickness of the light-emitting layer and the amount of drive current flowing therethrough being substantially constant.

In the above organic EL device, it is preferable that the first organic EL element can emit light of a first color, that the second organic EL element can emit light of a second color different from the first color, that the first organic EL element include a first light-emitting layer, that the second organic EL element include a second light-emitting layer, and that the first and second light-emitting layers be formed by different methods.

In this case, the first and second light-emitting layers are formed by different methods in the first and second film-formation regions, respectively, where the base layer has different levels of surface irregularities. Accordingly, methods appropriate for the levels of surface irregularities on the base layer can be selected to form light-emitting layers having reduced variations in thickness than those formed by the same method.

In the above organic EL device, it is preferable that the base layer have a higher surface irregularity in a region overlapping the first film-formation region in plan view than in a region overlapping the second film-formation region in plan view.

In this case, the first and second light-emitting layers are less affected by the surface irregularity of the base layer in the first and second film-formation regions because they are formed by different methods, thus having reduced variations in thickness.

In the above organic EL device, it is preferable that a layer of the same material as the first light-emitting layer be formed on the second light-emitting layer by the same process as the first light-emitting layer.

In this case, the first light-emitting layer is formed not only in the film-formation region, but also on the second light-emitting layer in the second film-formation region by the same process. This avoids the need to selectively form the first light-emitting layer only in the film-formation region by, for example, masking (shielding) the second film-formation region.

In the above organic EL device, it is preferable that the partitioning portion further define a third film-formation region adjacent to the first and second film-formation regions; that the organic EL device further include a third organic EL element disposed on the base layer at a position overlapping the third film-formation region in plan view and capable of emitting light of a third color different from the first and second colors, a third drive circuit section disposed in the base layer to control driving of the third organic EL element, and first and second data lines disposed between the second and third film-formation regions so as to extend across the first film-formation region in plan view; that the third light-emitting layer of the third organic EL element be formed by a method different from the method for forming the first light-emitting layer of the first organic EL element; that at least part of the third drive circuit section overlap the first film-formation region in plan view; that the first data line be electrically connected to one of the first, second, and third drive circuit sections; and that the second data line be electrically connected to one of the first, second, and third drive circuit sections excluding the drive circuit section electrically connected to the first data line.

In this case, at least parts of the drive circuit sections of at least three organic EL elements that emit light of different colors are disposed in the first film-formation region. This allows the base layer to have different levels of surface irregularities in the first film-formation region and in the second and third film-formation regions. Therefore, at least the second and third light-emitting layers of the second and third organic EL elements formed in the second and third film-formation regions have reduced variations in thickness. Accordingly, at least the second and third organic EL elements of the organic EL device can emit light with stable luminance. For example, if the organic EL device emits red, green, and blue light, it serves as a beautiful full-color display device.

In the above organic EL device, it is preferable that the first, second, and third drive circuit sections each include a thin-film transistor and a hold capacitor and that the thin-film transistors and the hold capacitors of the first, second, and third drive circuit sections be disposed at positions overlapping the first film-formation region in plan view.

In this case, the second and third film-formation regions have no factors contributing to formation of irregularities on the surface of the base layer. Accordingly, at least the second and third light-emitting layers of the second and third organic EL elements have reduced variations in thickness.

In the above organic EL device, it is preferable that the first, second, and third drive circuit sections each include a thin-film transistor and a hold capacitor; that the thin-film transistors of the first, second, and third drive circuit sections be disposed at positions overlapping the first film-formation region in plan view; that the hold capacitor of the first drive circuit section be disposed at a position overlapping the first film-formation region in plan view; that the hold capacitor of the second drive circuit section be disposed at a position overlapping the second film-formation region in plan view; and that the hold capacitor of the third drive circuit section be disposed at a position overlapping the third film-formation region in plan view.

In this case, the base layer has a higher surface flatness in the second and third film-formation regions, where the hold capacitors are disposed, than in the first film-formation region, where the thin-film transistors and the hold capacitor are disposed. Accordingly, at least the second and third light-emitting layers of the second and third organic EL elements have reduced variations in thickness.

In addition, the design flexibility of the hold capacitors corresponding to at least three organic EL elements is improved as compared to the case where they are disposed in the first film-formation region together with the thin-film transistors.

In the above organic EL device, it is preferable that the first light-emitting layer of the first organic EL element be formed by evaporation or spin coating and that the second light-emitting layer of the second organic EL element be formed by droplet ejection.

In this case, the first light-emitting layer is formed in the first film-formation region, where the base layer has a lower flatness than in the second film-formation region, by evaporation or spin coating because they provide superior coverage. The second light-emitting layer, on the other hand, is formed in the second film-formation region, where the base layer has a higher flatness than in the first film-formation region, by droplet ejection. Accordingly, the first and second light-emitting layers have reduced variations in thickness.

A method according to a second aspect of the invention for producing an organic EL device including first and second organic EL elements above a substrate includes forming a first drive circuit section that controls driving of the first organic EL element and a second drive circuit section that controls driving of the second organic EL element above the substrate; forming a partitioning portion on a base layer including the first and second drive circuit sections so as to define first and second film-formation regions adjacent to each other; and forming the first organic EL element on the base layer at a position overlapping the first film-formation region in plan view and forming the second organic EL element on the base layer at a position overlapping the second film-formation region in plan view. At least part of the first drive circuit section and at least part of the second drive circuit section are formed so as to overlap the first film-formation region in plan view.

In this method, the drive circuit sections are formed such that at least parts of the drive circuit sections of at least two organic EL elements are formed in the first film-formation region defined by the partitioning portion. This allows the base layer to have less surface irregularities in the second film-formation region than in the first film-formation region. Thus, the first and second film-formation regions have different levels (states) of surface irregularities. In the formation of the second organic EL element, therefore, at least the formation of a light-emitting layer is less affected by surface irregularities, so that it can be formed with reduced variations in thickness. Accordingly, an organic EL device in which at least the second organic EL element can emit light with stable luminance can be produced.

In the above method for producing an organic EL device, it is preferable that the first organic EL element can emit light of a first color, that the second organic EL element can emit light of a second color different from the first color, and that a first light-emitting layer of the first organic EL element and a second light-emitting layer of the second organic EL element be formed by different methods.

In this case, the first and second light-emitting layers are formed by different methods in the first and second film-formation regions, respectively, where the base layer has different levels of surface irregularities. Accordingly, methods appropriate for the levels of surface irregularities on the base layer can be selected to form light-emitting layers having smaller variations in thickness than those formed by the same method.

In the above method for producing an organic EL device, it is preferable that the first light-emitting layer be formed by evaporation or spin coating and that the second light-emitting layer be formed by droplet ejection.

In this case, the first light-emitting layer is formed in the first film-formation region by evaporation or spin coating because they provide superior coverage. The second light-emitting layer, on the other hand, is formed in the second film-formation region, where the base layer has a higher flatness than in the first film-formation region, by droplet ejection. Accordingly, the first and second light-emitting layers have reduced variations in thickness.

It is preferable that an electronic apparatus include the above organic EL device.

This electronic apparatus provides a beautiful display because it includes the organic EL device in which at least the second organic EL element can emit light with stable luminance.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described with reference to the drawings, where the portions to be described are scaled up or down where needed for visibility.

First Embodiment

Organic EL Device

Figure 1:
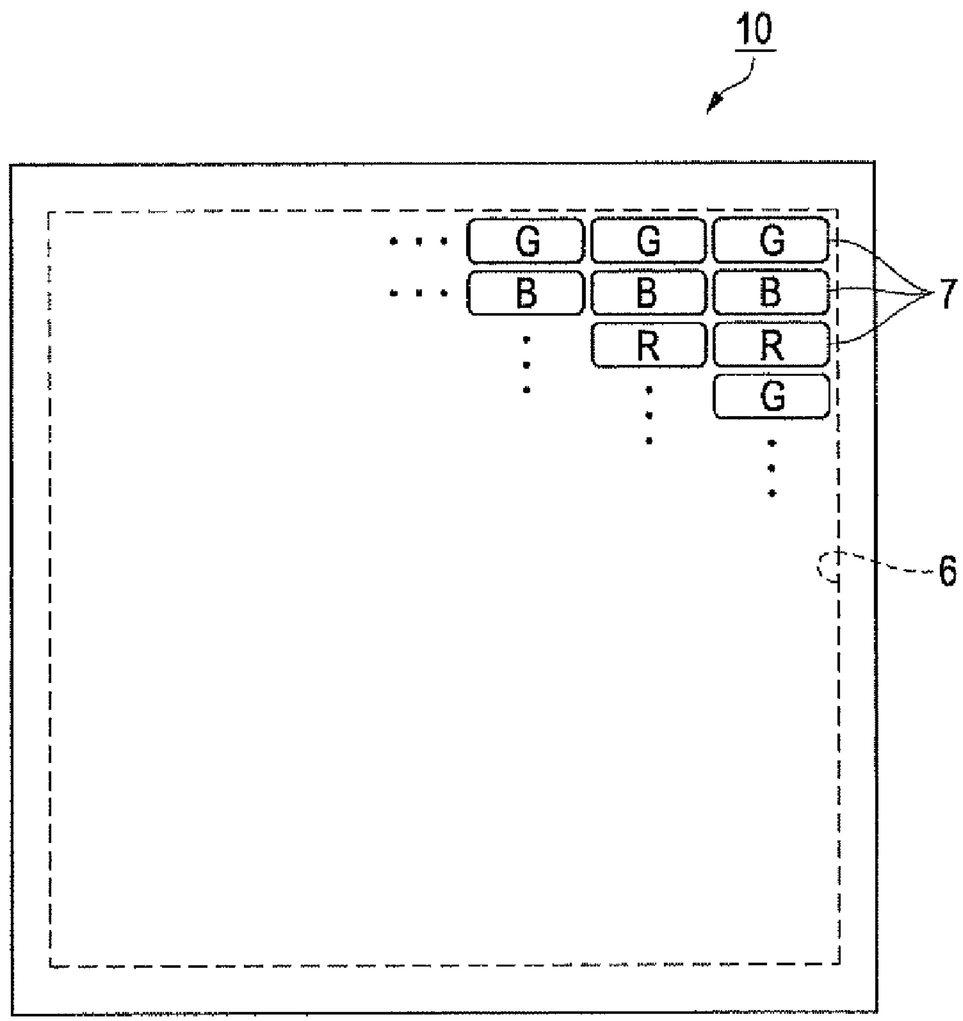
FIG. 1 is a schematic plan view of an organic EL device according to a first embodiment of the invention.
Figure 2:
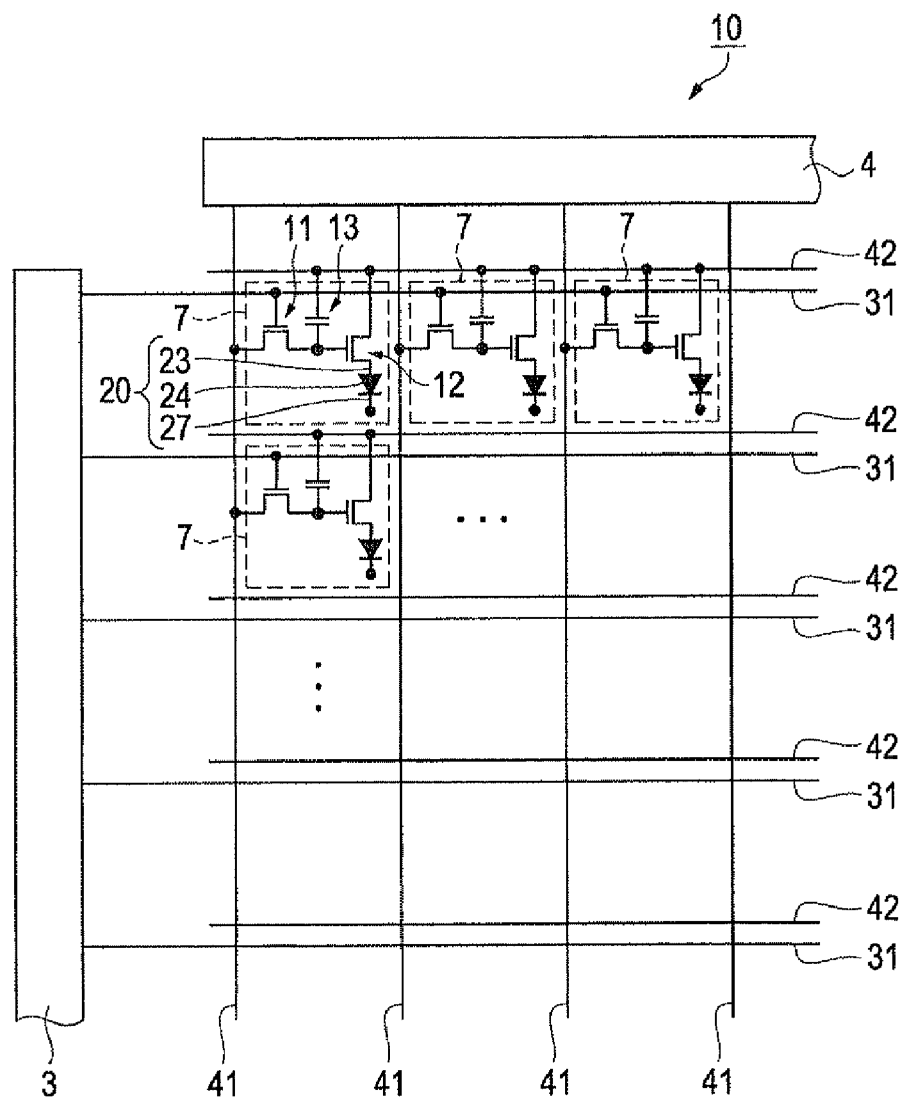
FIG. 2 is an equivalent circuit diagram of the organic EL device according to the first embodiment.
Figure 3:
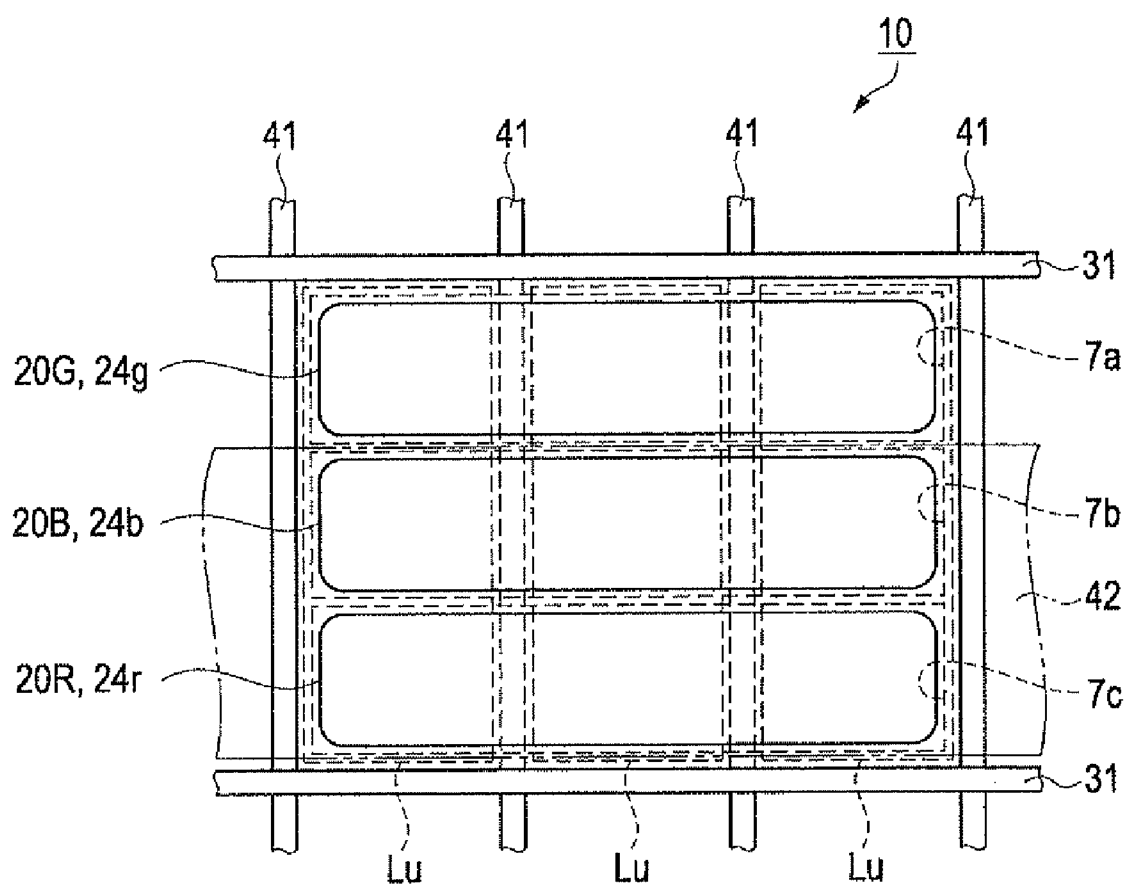
FIG. 3 is a schematic plan view showing the structure of light-emitting pixels in the organic EL device according to the first embodiment.
Figure 4:
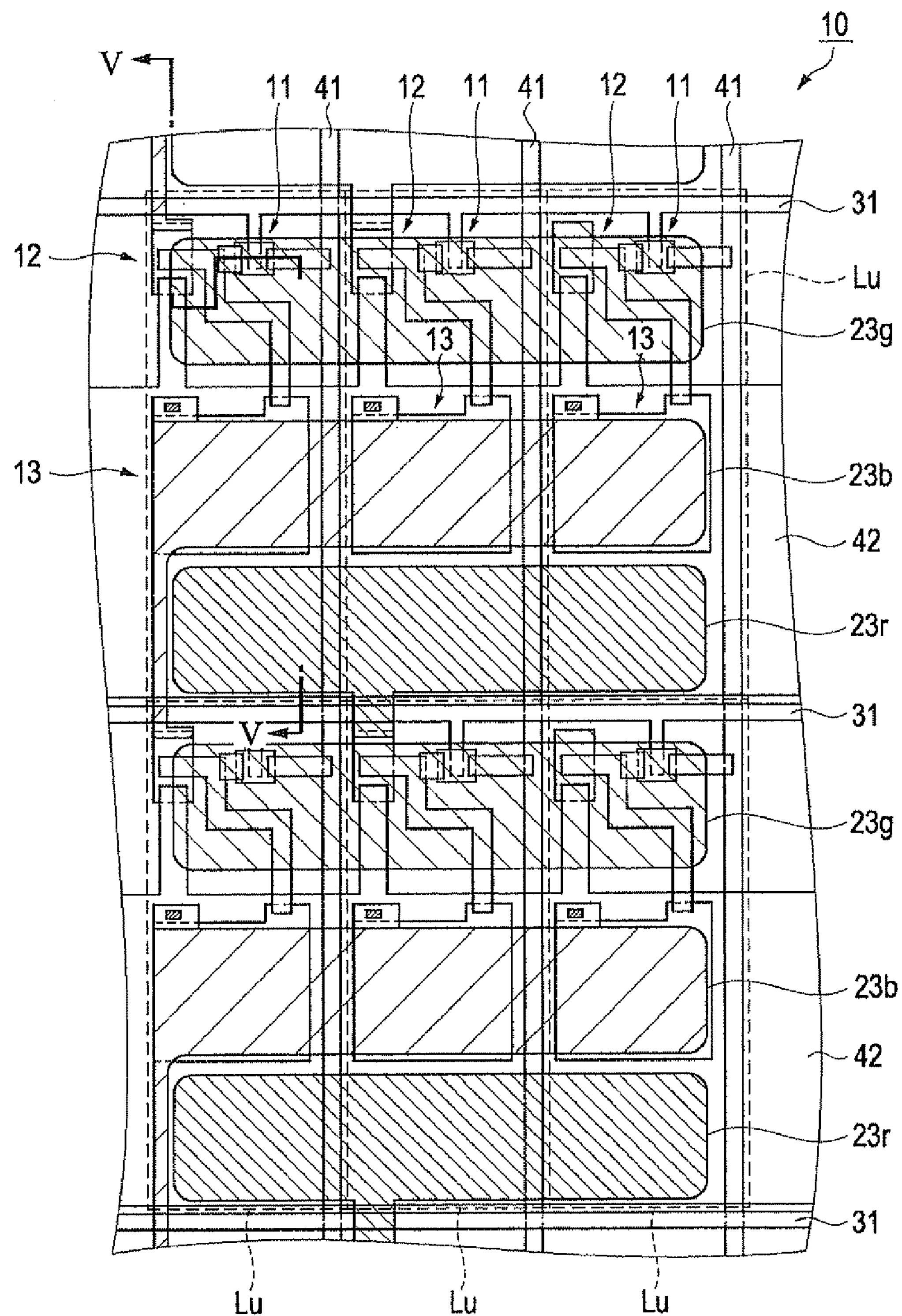
FIG. 4 is a plan view showing the detailed structure of the light-emitting pixels in the organic EL device according to the first embodiment.
Figure 5:
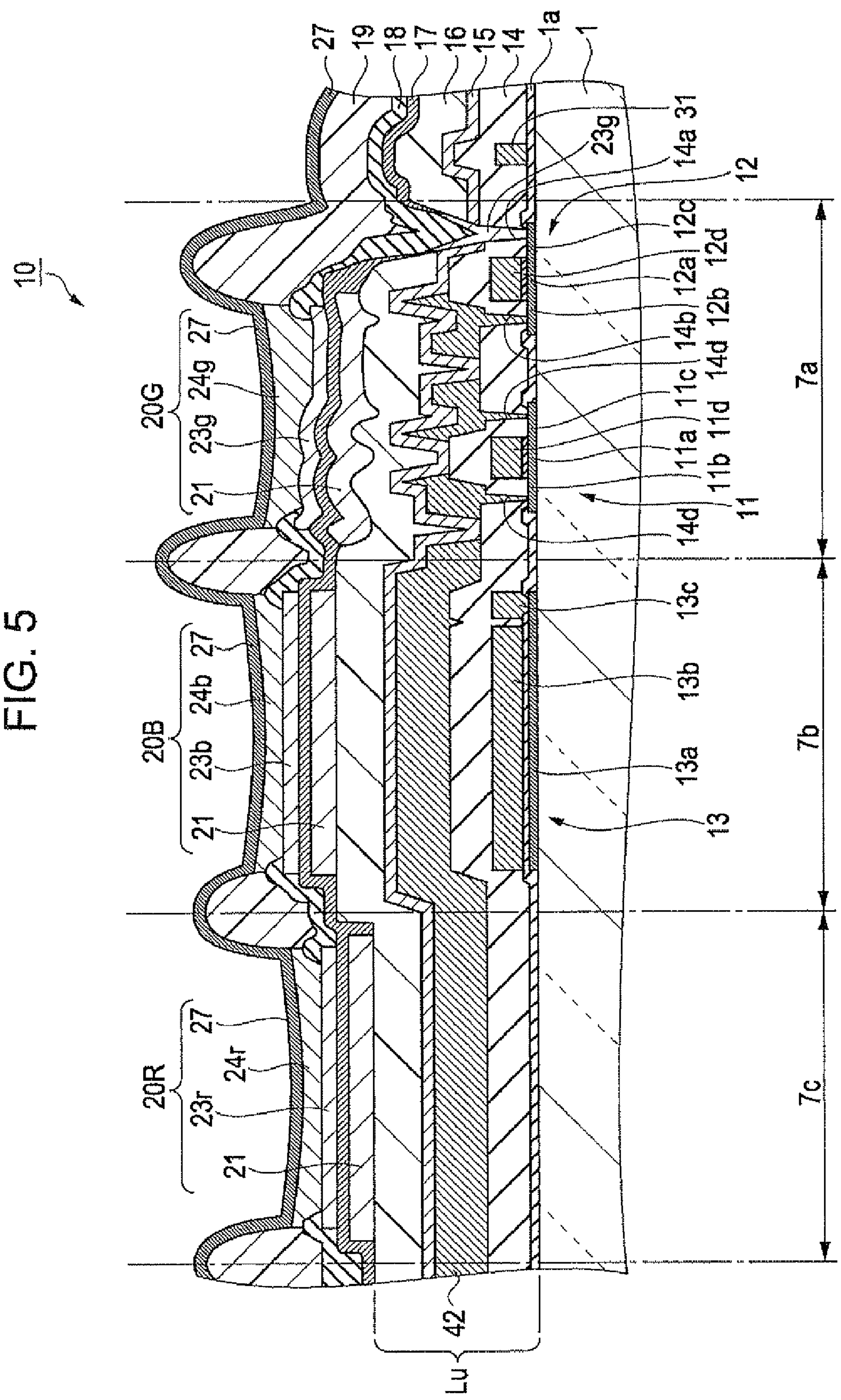
FIG. 5 is a sectional view taken along line V-V of FIG. 4, showing the structure of the light-emitting pixels.
Figure 6:
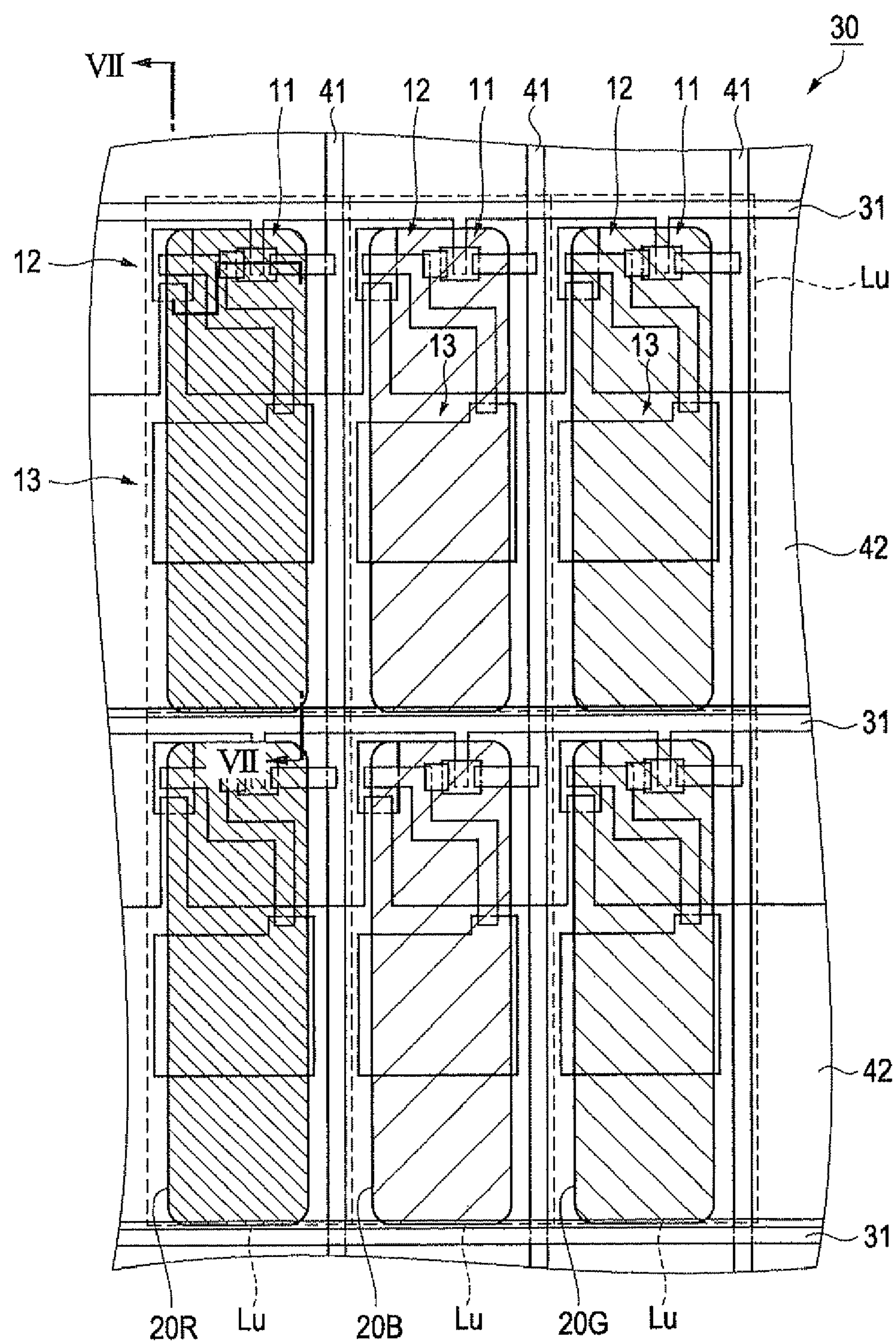
FIG. 6 is a plan view showing the structure of light-emitting pixels in an organic EL device serving as a comparative example.
Figure 7:
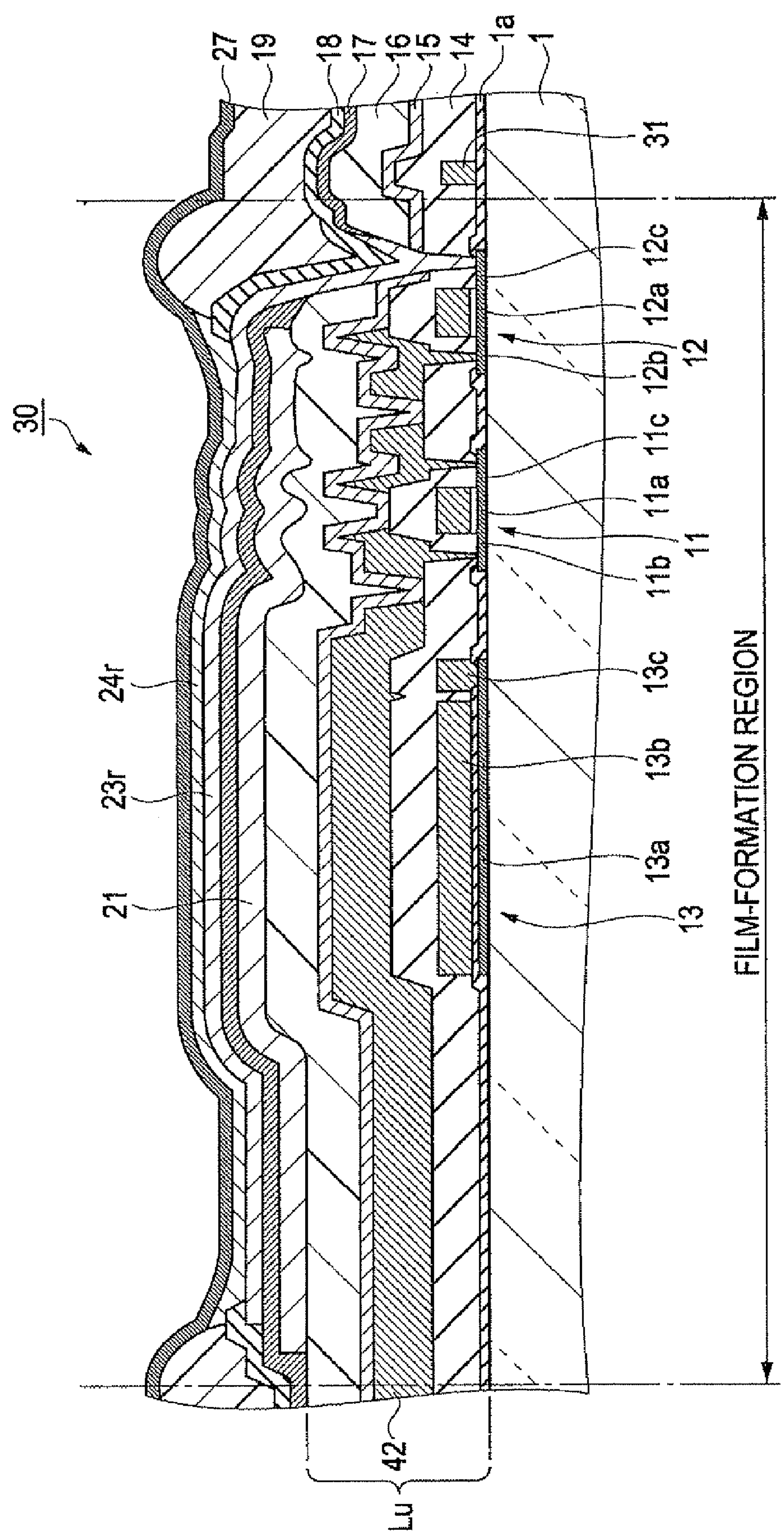
FIG. 7 is a sectional view taken along line VII-VII of FIG. 6, showing the structure of the light-emitting pixels in the comparative example.

First, an organic EL device according to this embodiment will be described with reference to FIGS. 1 to 7. FIG. 1 is a schematic plan view of the organic EL device. FIG. 2 is an equivalent circuit diagram of the organic EL device. FIG. 3 is a schematic plan view showing the structure of light-emitting pixels. FIG. 4 is a plan view showing the detailed structure of the light-emitting pixels. FIG. 5 is a sectional view taken along line V-V of FIG. 4, showing the structure of the light-emitting pixels. FIG. 6 is a plan view showing the structure of light-emitting pixels in an organic EL device serving as a comparative example. FIG. 7 is a sectional view taken along line VII-VII of FIG. 6, showing the structure of the light-emitting pixels in the comparative example.

Referring to FIG. 1, an organic EL device 10 according to this embodiment has light-emitting pixels 7 that emit red (R), green (G), and blue (B) light (emission colors). The light-emitting pixels 7 are substantially rectangular and are arranged in a matrix in a light-emitting region (display region) 6. The light-emitting pixels 7 that emit light of the same colors are arranged horizontally (in the row direction or the longitudinal direction of the light-emitting pixels 7) in the drawings, whereas the light-emitting pixels 7 that emit light of different colors are arranged vertically (in the column direction or the lateral direction of the light-emitting pixels 7) in the drawings in the order of G, B, and R. That is, the light-emitting pixels 7 that emit light of different colors are arranged in a stripe pattern.

If the organic EL device 10 is used as a display device, three light-emitting pixels 7 that emit light of different colors, serving together as one display pixel unit, are each electrically controlled. The organic EL device can thus provide a full-color display.

Referring to FIG. 2, the organic EL device 10 is an active-matrix device including TFTs serving as switching elements for driving the light-emitting pixels 7.

The organic EL device 10 includes scan lines 31 connected to a scan-line drive section 3, data lines 41 connected to a data-line drive section 4, and power lines 42 disposed parallel to the individual scan lines 31. Emission of light from the light-emitting pixels 7 is controlled by drive circuit sections disposed in regions defined by the scan lines 31 and the data lines 41, which are insulated from and cross each other.

The drive circuit sections include switching TFTs 11 whose gate electrodes are supplied with scan signals via the scan lines 31, hold capacitors 13 that hold pixel signals supplied from the data lines 41 via the TFTs 11, and drive TFTs 12 whose gate electrodes are supplied with the pixel signals held by the hold capacitors 13. The organic EL device 10 further includes pixel electrodes 23 into which a drive current flows from the power lines 42 when the pixel electrodes 23 are electrically connected to the power lines 42 via the drive TFTs 12 and functional layers 24 held between the pixel electrodes 23 and a common electrode 27.

When the scan lines 31 are driven to switch the switching TFTs 11 on, the potentials of the data lines 41 at that moment are held by the hold capacitors 13. The state of the hold capacitors 13 determines the on/off state of the drive TFTs 12. A current flows from the power lines 42 into the pixel electrodes 23 via the drive TFTs 12 and then flows into the common electrode 27 via the functional layers 24, which emit light depending on the current flowing therethrough. That is, the pixel electrodes 23, the common electrode 27, and the functional layers 24 constitute organic EL elements 20 serving as emission units.

Next, the arrangement of the individual components on the substrate in the organic EL device 10 will be described with reference to FIGS. 3 and 4.

Referring to FIG. 3, emission control units Lu are provided in the regions defined by the scan lines 31 and the data lines 41, which are arranged in a grid pattern and are insulated from each other, so as to have one-to-one correspondence with the drive circuit sections. The emission control units Lu include the TFTs 11 and 12, the hold capacitors 13, and wiring lines connected thereto.

Depending on surface steps (irregularities) formed after the drive circuit sections are provided on the substrate, each region extending over three emission control units Lu adjacent along the scan lines 31 is separated into a first film-formation region 7*a* including the TFTs 11 and 12, which constitute parts of the drive circuit sections; a second film-formation region 7*b* including the hold capacitors 13, which constitute parts of the drive circuit sections; and a third film-formation region 7*c* including the drive circuit sections excluding the TFTs 11 and 12 and the hold capacitors 13.

An organic EL element 20G (first organic EL element) including a functional layer 24*g* that emits green (G) light is disposed in the first film-formation region 7*a*. An organic EL element 20B (second organic EL element) including a functional layer 24*b* that emits blue (B) light is disposed in the second film-formation region 7*b*. An organic EL element 20R (third organic EL element) including a functional layer 24*r* that emits red (R) light is disposed in the third film-formation region 7*c*. In other words, the three organic EL elements 20G, 20B, and 20R that emit light of different colors are provided so as to extend across the same number of emission control units Lu. The organic EL elements 20G, 20B, and 20R are also referred to as the organic EL elements 20 to describe the common features thereof.

The power line 42 is disposed between the layer including the scan lines 31 and the data lines 41 and the layer including the organic EL elements 20 above the substrate. The power line 42 is disposed along the scan lines 31 so as to extend over the second film-formation region 7*b* and the third film-formation region 7*c*.

Specifically, as shown in FIG. 4, the TFTs 11 and 12 are disposed near the scan lines 31 and the data lines 41. The TFTs 11 and 12 have wiring lines connected to the scan lines 31, the data lines 41, and the hold capacitors 13 and wiring lines connecting together the TFTs 11 (drains) and the TFTs 12 (gates).

The TFTs 12 have one (source) of the three terminals (gate, source, and drain) connected to the power line 42 to control the current flowing from the power line 42 into the organic EL elements 20 and has a larger planar area than the TFTs 11 for switching the organic EL elements 20 for sufficient withstand current and voltage.

The hold capacitors 13 are substantially square in plan view, are disposed in nearly the centers of the emission control units Lu, and account for about one third the planar area of the emission control units Lu. The electrical capacitance of the hold capacitors 13 is determined depending on the frame frequency of scan signals, off-state current leakage from the drive TFTs 12, and the luminous characteristics of the organic EL elements 20. Accordingly, the planar area of the hold capacitors 13 is actually determined by setting appropriate electrical capacitance.

The pixel electrode 23*g* of the organic EL element 20G that emits green (G) light is disposed over the region where the TFTs 11 and 12 of the three adjacent emission control units Lu are disposed, namely, the first film-formation region 7*a*. Of the three emission control units Lu arranged along the scan lines 31, the pixel electrode 23*g* is connected to the TFT 12 (drain) of the rightmost emission control unit Lu.

The pixel electrode 23*b* of the organic EL element 20B that emits blue (B) light is disposed over the region where the hold capacitors 13 of the three adjacent emission control units Lu are disposed, namely, the second film-formation region 7*b*. Of the three emission control units Lu arranged along the scan lines 31, the pixel electrode 23*b* is connected to the TFT 12 (drain) of the leftmost emission control unit Lu.

The pixel electrode 23*r* of the organic EL element 20R that emits red (R) light is disposed over the region where the TFTs 11 and 12 and the hold capacitors 13 of the three adjacent emission control units Lu are not disposed, namely, the third film-formation region 7*c*. Of the three emission control units Lu arranged along the scan lines 31, the pixel electrode 23*r* is connected to the TFT 12 (drain) of the central emission control unit Lu.

For convenience of wiring, the pixel electrodes 23*b* and 23*r* are actually connected to the TFTs 12 (drains) of three other emission control units Lu adjacent along the data lines 41 to the three emission control units Lu, although the method for connecting the pixel electrodes 23*b*, 23*g*, and 23*r* and the TFTs 12 are not limited thereto.

Next, the structure of the organic EL device 10 in the thickness direction will be described with reference to FIG. 5.

Referring to FIG. 5, the emission control units Lu and the organic EL elements 20 of the individual emission colors (separately referred to as organic EL elements 20B, 20G, and 20R) are stacked on an element substrate 1 serving as the substrate. In other words, the organic EL elements 20B, 20G, and 20R are disposed on a base layer including the emission control units Lu.

In this embodiment, the base layer includes the element substrate 1, the emission control units Lu, reflective layers 21, and an insulating film 17.

The element substrate 1 used is a transparent substrate of, for example, glass or resin, or a nontransparent substrate of, for example, silicon. Semiconductor layers 11*a*, 12*a*, and 13*a* formed of, for example, polysilicon films are arranged in an island-like pattern on the surface of the element substrate 1. The semiconductor layer 11*a* constitutes the TFT 11, whereas the semiconductor layer 12*a* constitutes the TFT 12. The semiconductor layer 13*a* constitutes an electrode of the hold capacitor 13; therefore, it is also referred to as the electrode 13*a*.

A gate insulating film 1*a* is disposed so as to cover substantially the entire surface of the element substrate 1 excluding the edges and gates of the island-like semiconductor layers 11*a* and 12*a* and part of the semiconductor layer 13*a*. A portion of the gate insulating film 1*a* covering the semiconductor layer 13*a* functions as a dielectric layer. The gate insulating film 1*a* has a thickness of about 50 to 100 nm.

The scan lines 31, the data lines 41 (not shown), and gate electrodes 11*d* and 12*d* of the TFTs 11 and 12 are formed on the gate insulating film 1*a* by providing and patterning a low-resistance metal wiring layer of, for example, aluminum (Al), tantalum (Ta), tungsten (W), or a metal compound thereof. The low-resistance metal wiring layer also forms the other electrode 13*b* of the hold capacitor 13 and a wiring line 13*c* connected to the electrode 13*a* thereof. An interlayer insulating film 14 is disposed so as to cover the components described above. The low-resistance metal wiring layer has a thickness of about 500 to 600 nm. Similarly, the interlayer insulating film 14 has a thickness of about 500 to 600 nm.

The interlayer insulating film 14 has contact holes 14*a*, 14*b*, 14*c*, and 14*d* for connection to the sources and drains of the TFTs 11 and 12 and also has contact holes (not shown) for connecting the hold capacitor 13 to the power line 42 and the TFT 12.

The power line 42 and other wiring lines such as for connection to the power line 42 and via the contact holes 14*b*, 14*c*, and 14*d* are formed on the interlayer insulating film 14 by providing and patterning a low-resistance metal wiring layer of, for example, aluminum, tantalum, tungsten, or a metal compound thereof. The low-resistance metal wiring layer has a thickness of about 500 to 600 nm.

A protective film 15 is disposed so as to cover the power line 42 and the interlayer insulating film 14, and a planarizing layer 16 is disposed so as to cover the protective film 15. The gate insulating film 1*a*, the interlayer insulating film 14, and the protective film 15 are formed of, for example, a silicon compound such as SiN, SiO, or $SiO_2$ or an inorganic mixture thereof. The protective film 15 has a thickness of about 200 to 300 nm. The planarizing layer 16 is formed of, for example, an organic resin such as an acrylic or epoxy resin and has a thickness of about 1 to 2 μm.

Despite the formation of the planarizing layer 16, which is thicker than the low-resistance metal wiring layer and the interlayer insulating film 14, the planarizing layer 16 on the element substrate 1 has surface steps. In particular, the planarizing layer 16 has more surface irregularities in the first film-formation region 7*a*, where the TFTs 11 and 12 are disposed, than in the second film-formation region 7*b*, where the hold capacitor 13 is disposed, and the third film-formation region 7*c* because the contact holes 14*a*, 14*b*, 14*c*, and 14*d* and the wiring lines for connection to the TFTs 11 and 12 are formed.

In this case, the flatness of the planarizing layer 16 is highest in the third film-formation region 7*c*, where no semiconductor layers or low-resistance metal wiring layer segments connected thereto are disposed, and decreases with increasing irregularities, namely, in the order of the second film-formation region 7*b* and the first film-formation region 7*a*.

The organic EL elements 20B, 20G, and 20R of different emission colors are arranged depending on the steps (level or state of surface irregularities) over the drive circuit sections on the element substrate 1. Specifically, the organic EL element 20G is disposed in the first film-formation region 7*a*, the organic EL element 20B is disposed in the second film-formation region 7*b*, and the organic EL element 20R is disposed in the third film-formation region 7*c*.

The organic EL element 20G disposed in the first film-formation region 7*a* includes the reflective layer 21, the insulating film 17, the pixel electrode 23*g*, the functional layer 24*g*, and the common electrode 27, which are stacked on the planarizing layer 16 in the above order. The other organic EL elements 20B and 20R are similar to the organic EL element 20G.

The reflective layers 21 and the insulating film 17 are unnecessary if the pixel electrodes 23 are formed of a reflective material. In this case, the basic structure of the organic EL elements 20 includes the pixel electrodes 23, the functional layers 24, and the common electrode 27.

The reflective layers 21 are formed of, for example, a reflective metal material such as an aluminum-neodymium alloy (Al—Nd) and have a thickness of about 50 to 100 nm. The insulating film 17 covering the reflective layers 21 is formed of a transparent inorganic material such as SiN or SiO and has a thickness of about 50 to 100 nm. The pixel electrodes 23*b*, 23*g*, and 23*r* are formed of transparent conductive films such as indium tin oxide (ITO) or indium zinc oxide (IZO) films and have a thickness of about 50 to 100 nm.

The pixel electrodes 23*b*, 23*g*, and 23*r* are substantially defined by an insulating film 18 disposed so as to cover the edges of the pixel electrodes 23*b*, 23*g*, and 23*r* and a partitioning portion 19 disposed on the insulating film 18. The insulating film 18 is formed of an inorganic insulating material such as $SiO_2$ and has a thickness of about 50 to 100 nm. The partitioning portion 19 is formed of a resin material such as a phenolic or polyimide resin and has a thickness of about 1 to 2 μm.

The functional layers 24*b*, 24*g*, and 24*r* that emit light of different colors are formed by applying liquids containing functional materials into the first, second, and third film-formation regions 7*a*, 7*b*, and 7*c*, which are substantially defined by the partitioning portion 19, and solidifying the liquids. The details will be shown later in the description of a method for producing the organic EL device 10.

The common electrode 27 is disposed so as to cover the partitioning portion 19 and the functional layers 24*b*, 24*g*, and 24*r*. The common electrode 27 is formed of a transparent conductive film such as an ITO or IZO film and has a thickness of about 50 to 100 nm.

A sealing substrate (not shown), such as a transparent glass substrate, is bonded to the element substrate 1, on which the light-emission control units Lu and the organic EL elements 20B, 20G, and 20R are disposed, to seal the element substrate 1 so that external moisture and gases such as oxygen do not intrude into the functional layers 24*b*, 24*g*, and 24*r*.

The reflective layers 21 reflect light emitted from the functional layers 24*b*, 24*g*, and 24*r* so that it can be efficiently output from the sealing substrate side. The structure of the organic EL elements 20B, 20G, and 20R, however, is not limited thereto; for example, an optical resonator structure may be introduced between the functional layers 24*b*, 24*g*, and 24*r* and the reflective layers 21 to improve luminance for each emission color.

Next, an organic EL device serving as a comparative example will be described with reference to FIGS. 6 and 7. The same portions as those of the organic EL device 10 according to the first embodiment are denoted by the same reference numerals, and a detailed description thereof will be omitted.

Referring to FIG. 6, an organic EL device 30 serving as the comparative example is the same as the organic EL device 10 in the arrangement of the emission control units Lu, which include the TFTS 11 and 12, the hold capacitors 13, and the wiring lines connected thereto, but is different in the planar arrangement of the organic EL elements 20B, 20G, and 20R. Specifically, substantially rectangular organic EL elements 20 (20B, 20G, and 20R) are provided in substantially rectangular regions (film-formation regions) where the emission control units Lu are disposed. Each organic EL element 20 is not disposed so as to extend across a plurality of emission control units Lu.

Referring to FIG. 7, for example, the functional layer 24*r* that emits red light is disposed over a film-formation region defined by the partitioning portion 19 and having the emission control unit Lu. In particular, if the functional layer 24*r* is formed by applying a liquid containing a functional material into the film-formation region, the applied liquid tends to flow into a step region at the lowest level, that is, the region where the TFTs 11 and 12 and the hold capacitor 13 are not disposed. Therefore, if the applied liquid is solidified, the functional layer 24 formed over the steps has variations in thickness at different sites.

If light is emitted from the functional layer 24*r* by supplying a current, variations in luminance occur due to the variations in thickness. As for reliability, the emission life may be shortened because a current tends to concentrate on the thinnest portion.

Unlike the organic EL device 30 serving as the comparative example, the organic EL device 10 according to this embodiment has the organic EL elements 20 disposed in the first, second, and third film-formation regions 7*a*, 7*b*, and 7*c*, which are separated depending on steps (level or state of surface irregularities) on the planarizing layer 16 on the element substrate 1. Accordingly, the functional layers 24*b*, 24*g*, and 24*r* have reduced variations in thickness, so that the organic EL device 10 achieves reduced variations in luminance.

In particular, the green functional layer 24*g* is preferably disposed in the first film-formation region 7*a* having the TFTs 11 and 12. Even if the functional layer 24*g* has variations in thickness due to surface irregularities in the first film-formation region 7*a*, a larger current can be supplied to reduce variations in luminance without decreasing the emission life of the organic EL device 10 itself because the functional layer 24*g* has a longer emission life than the other functional layers 24*b* and 24*r*.

Method for Producing Organic EL Device

Next, a method for producing the organic EL device 10 according to this embodiment will be described with reference to FIGS. 8A and 8B, 9C and 9D, and 10E to 10G, which are schematic diagrams illustrating the method for producing the organic EL device 10.

The method for producing the organic EL device 10 according to this embodiment includes a drive-circuit forming step of forming the drive circuit sections on the element substrate 1; a reflective-layer forming step of forming the reflective layers 21 on the drive circuit sections; a pixel-electrode forming step of forming the pixel electrodes 23*b*, 23*g*, and 23*r* so as to be electrically connected to the drive circuit sections; a partitioning-portion forming step of forming the partitioning portion 19 so as to define the film-formation regions including the pixel electrodes 23*b*, 23*g*, and 23*r*; a functional-layer forming step of forming the functional layers 24*b*, 24*g*, and 24*r* in the film-formation regions defined by the partitioning portion 19; and a common-electrode forming step of forming the common electrode 27 so as to cover the partitioning portion 19 and the functional layers 24*b*, 24*g*, and 24*r*.

Figure 8A:
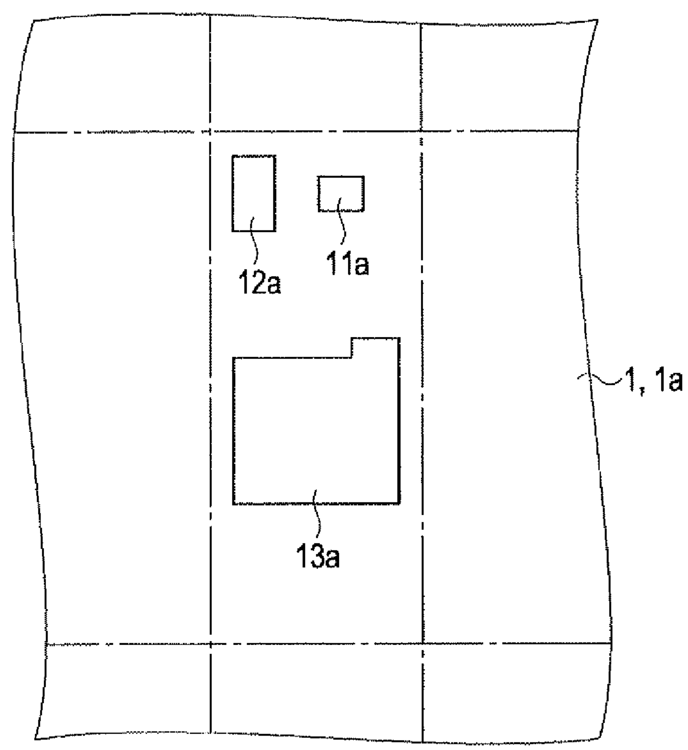
FIGS. 8A and 8B are schematic plan views illustrating a method for producing the organic EL device according to the first embodiment.

In the drive-circuit forming step, as shown in FIG. 8A, a polysilicon film is formed on the element substrate 1 and is patterned by photolithography to form the semiconductor layers 11*a*, 12*a*, and 13*a* in an island-like pattern. The polysilicon film can be formed by a known technique such as low-pressure chemical vapor deposition (CVD).

The gate insulating film 1*a* is then formed so as to cover the element substrate 1 after masking the source and drain sides of the semiconductor layers 11*a* and 12*a*, which correspond to the TFTs 11 and 12, respectively, and electrical connection portions of the semiconductor layers 13*a*. The gate insulating film 1*a* is formed by, for example, sputtering in a vacuum using SiN or SiO as a target so as to have a thickness of about 50 to 100 nm.

Figure 8B:
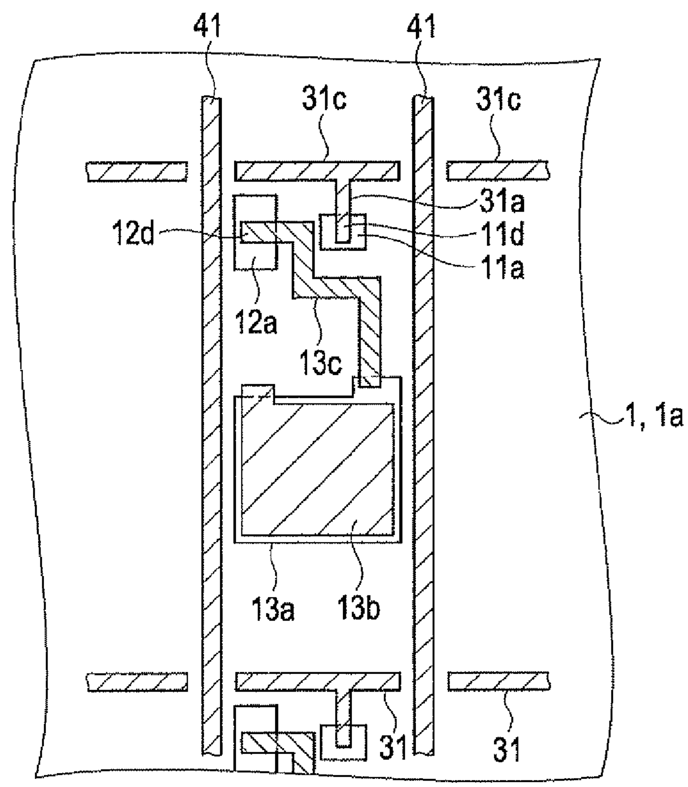

Next, a low-resistance metal film such as an aluminum film is formed on the gate insulating film 1*a* by, for example, sputtering so as to have a thickness of about 500 to 600 nm. The metal film is patterned by photolithography to form the scan lines 31, the data lines 41, wiring lines 31*a* extending from the scan lines 31 to the tops of the semiconductor layers 11*a* to constitute the gate electrodes 11*d*, wiring lines 13*c* (including the gate electrodes 12*d*) extending from the tops of the semiconductor layers 12*a* to the connection portions of the semiconductor layers 13*a*, and the electrodes 13*b* of the hold capacitors 13, as shown in FIG. 8B. The scan lines 31, extending perpendicularly to the data lines 41, are temporarily formed so as to be cut away from around the data lines 41.

Figure 9C:
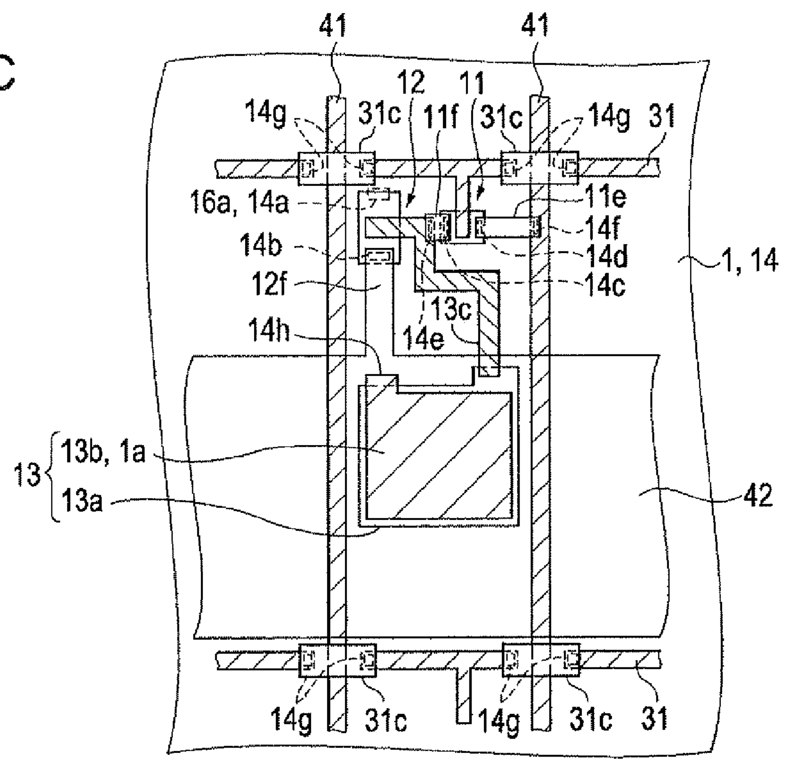
FIGS. 9C and 9D are a schematic plan view and a schematic sectional view, respectively, illustrating the method for producing the organic EL device according to the first embodiment.

Next, the interlayer insulating film 14 is formed so as to cover substantially the entire surface of the element substrate 1. The interlayer insulating film 14 is formed by, for example, sputtering in a vacuum using SiN or SiO as a target so as to have a thickness of about 500 to 600 nm. Regions where wiring lines excluding the power lines 42 are to be formed in the subsequent power-line forming step are masked in advance with, for example, a photosensitive resin material. The masked regions can be removed after the formation of the interlayer insulating film 14, thus forming the contact holes 14*a*, 14*b*, 14*c*, 14*d*, 14*e*, 14*f*, 14*g*, and 14*h*, as shown in FIG. 9C.

Next, a low-resistance metal film such as an aluminum film is formed on the interlayer insulating film 14 by, for example, sputtering so as to have a thickness of about 500 to 600 nm. The metal film is patterned by photolithography to form the power lines 42 and various wiring lines, as shown in FIG. 9C. For example, the contact holes 14*d* and 14*f* can be filled with the low-resistance metal film to form wiring lines 11*e* connecting together the data lines 41 and the sources of the TFTs 11. The contact holes 14*c* and 14*e* can be filled with the low-resistance metal film to form wiring lines 11*f* connecting together the drains of the TFTs 11 and the gates of the TFTs 12. The gaps between the pairs of contact holes 14*g* can be filled with the low-resistance metal film to form wiring lines 31*c* electrically connecting together the segments of the scan lines 31 over the data lines 41. The contact holes 14*b* and 14*h* can be filled with the low-resistance metal film to form wiring lines 12*f* connecting the power lines 42 to the sources of the TFTs 12 and the electrodes 13*b* of the hold capacitors 13.

Next, the drive circuit sections thus completed are covered with the protective film 15. The protective film 15 is formed by, for example, sputtering using SiN as a target so as to have a thickness of about 200 to 300 nm. The planarizing layer 16 is then formed so as to cover the protective film 15. The planarizing layer 16 is formed by, for example, applying and solidifying a photosensitive acrylic resin by a method such as spin coating or roll coating so as to have a thickness of about 1 to 2 μm and patterning the coating by photolithography. The patterning is performed mainly to form contact holes 16*a* communicating with the contact holes 14*a* for connection between the pixel electrodes 23*b*, 23*g*, and 23*r* and the drains of the TFTs 12. Alternatively, the portions corresponding to the contact holes 16*a* may be masked before the application of the planarizing-layer forming material.

Figure 9D:
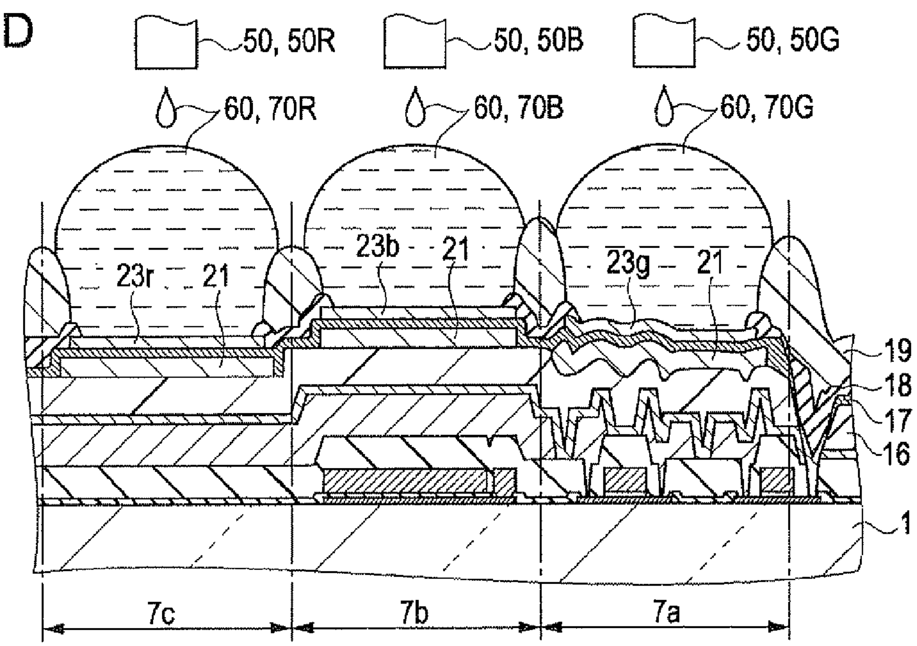

Next, in the reflective-layer forming step, as shown in FIG. 9D, the reflective layers 21 are formed in the first, second, and third film-formation regions 7*a*, 7*b*, and 7*c*, which are separated depending on steps (level or state of surface irregularities) on the planarizing layer 16. The reflective layers 21 are formed by, for example, depositing the reflective-layer forming material described above, namely, Al—Nd, by sputtering so as to have a thickness of about 50 to 100 nm and patterning the film by photolithography so as to have a slightly larger planar area than the pixel electrodes 23*b*, 23*g*, and 23*r*. The insulating film 17 is then formed so as to cover the reflective layers 21. The insulating film 17 is formed by, for example, sputtering in a vacuum using SiN or SiO as a target so as to have a thickness of about 50 to 100 nm.

In the pixel-electrode forming step, an ITO film is formed on the insulating film 17 by, for example, sputtering so as to have a thickness of about 100 nm. The ITO film is then patterned by photolithography to form the pixel electrodes 23*b*, 23*g*, and 23*r* above the reflective layers 21. In addition, the contact holes 16*a* are filled with the ITO film to connect the pixel electrodes 23*b*, 23*g*, and 23*r* to the TFTs 12 (drains). In this case, the pixel electrodes 23*b*, 23*g*, and 23*r* have nearly the same planar area.

Next, the insulating film 18 is formed so as to cover the edges of the pixel electrodes 23*b*, 23*g*, and 23*r*. The insulating film 18 is formed by, for example, sputtering using SiN or SiO as a target so as to have a thickness of about 50 to 100 nm after masking the portions of the pixel electrodes 23*b*, 23*g*, and 23*r* other than the edges thereof.

In the partitioning-portion forming step, subsequently, the partitioning portion 19 is formed on the insulating film 18 by applying and solidifying a phenolic or polyimide photosensitive resin material on the surface of the element substrate 1 so as to have a thickness of about 1 to 2 μm and subjecting the coating to exposure and development. Thus, as shown in FIG. 9D, the partitioning portion 19 substantially defines the first, second, and third film-formation regions 7*a*, 7*b*, and 7*c*. The first, second, and third film-formation regions 7*a*, 7*b*, and 7*c* have nearly the same planar area.

Next, the functional-layer forming step will be described. The functional-layer forming step in this embodiment includes a hole-injection/transport-layer forming step of forming hole injection/transport layers by applying and solidifying a liquid containing a hole-injection/transport-layer forming material and a light-emitting-layer forming step of forming light-emitting layers by applying and solidifying liquids containing light-emitting-layer forming materials.

In the hole-injection/transport-layer forming step, as shown in FIG. 9D, ejection heads (ink-jet heads) 50 capable of ejecting liquid from nozzles are used to apply a predetermined amount of liquid 60 in the form of droplets into the first, second, and third film-formation regions 7*a*, 7*b*, and 7*c*. The liquid 60 is a solution containing, for example, diethylene glycol and water (pure water) as a solvent and a mixture (PEDOT/PSS) of a polythiophene derivative, such as polyethylenedioxythiophene (PEDOT), and polystyrenesulfonate (PSS), serving as a dopant, in an amount of 0.5% by weight as the hole-injection/transport-layer forming material. The solvent content is adjusted so that the liquid 60 has a viscosity of about 20 mPa·s or less.

Hole-injection/transport-layer forming materials other than PEDOT/PSS include polystyrene, polypyrrole, polyaniline, polyacetylene, and derivatives thereof.

Figure 10E:
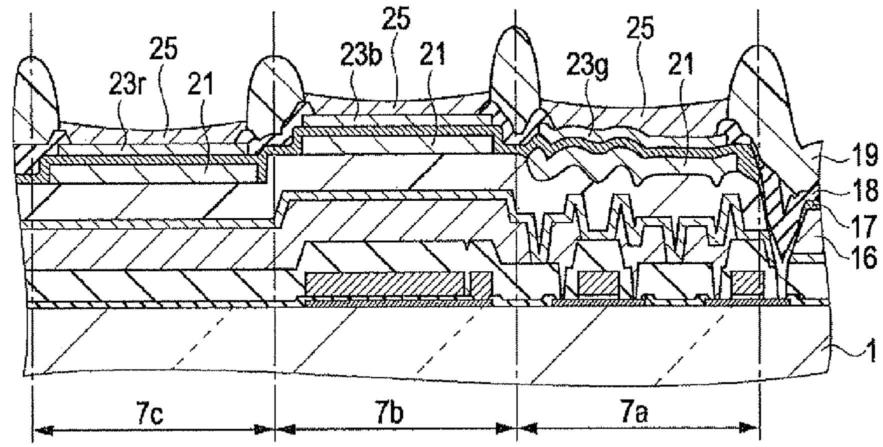
FIGS. 10E to 10G are schematic sectional views illustrating the method for producing the organic EL device according to the first embodiment.

The element substrate 1 onto which the liquid 60 has been applied is heat-dried by a method such as lamp annealing to evaporate the solvent, thus forming hole injection/transport layers 25 in the first, second, and third film-formation regions 7*a*, 7*b*, and 7*c*, as shown in FIG. 10E. Before the application of the liquid 60, the element substrate 1 may be subjected to surface treatment including lyophilic treatment of the surfaces of the pixel electrodes 23*b*, 23*g*, and 23*r* and liquid-repellent treatment of the surface of the partitioning portion 19. An example of the lyophilic treatment is plasma treatment using oxygen as a treatment gas, whereas an example of the liquid-repellent treatment is plasma treatment using a fluorinated gas as a treatment gas. The above surface treatment allows the applied liquid 60 to spread evenly over the pixel electrodes 23*b*, 23*g*, and 23*r*.

In the light-emitting-layer forming step, as shown in FIG. 9D, different liquids 70G, 70B, and 70R are charged into different ejection heads 50G, 50B, and 50R and are applied into the first, second, and third film-formation regions 7*a*, 7*b*, and 7*c*, respectively, in the form of droplets.

The liquids 70G, 703, and 70R contain, for example, cyclohexylbenzene as a solvent and polyfluorene derivatives (PF) that emit red, green, and blue light in an amount of 0.7% by weight as the light-emitting-layer forming materials. The liquids 70G, 70B, and 70R have a viscosity of about 14 mPa·s. Light-emitting-layer forming materials other than PF include poly(p-phenylenevinylene) derivatives (PPV), polyphenylene derivatives (PP), poly(p-phenylene) derivatives (PPP), polyvinylcarbazole (PVK), polythiophene derivatives such as PEDOT, and polymethylphenylsilane (PMPS). These polymer materials may be doped with a polymer material such as a perylene dye, a coumarin dye, or a rhodamine dye or a low-molecular-weight material such as rubrene, perylene, 9,10-diphenylanthracene, tetraphenylbutadiene, Nile red, coumarin 6, or quinacridone.

Figure 10F:
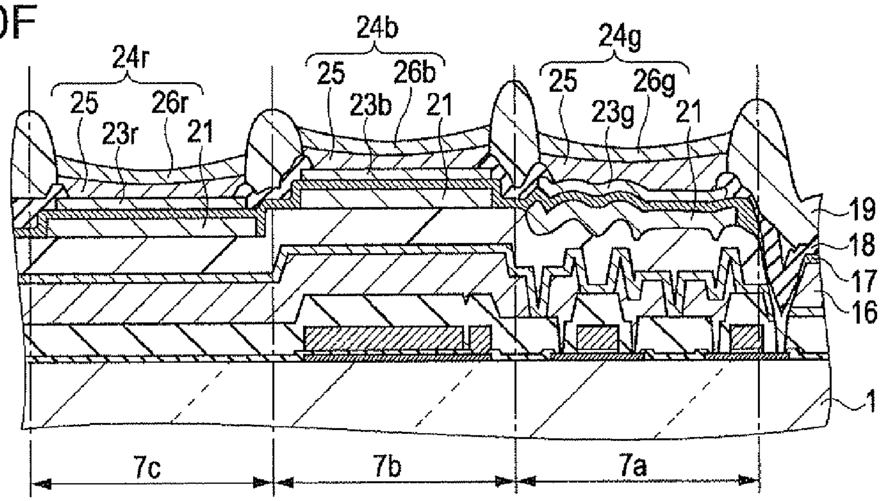

The applied liquids 70G, 70B, and 70R are dried (solidified) by vacuum drying, which evaporates the solvent more evenly than common heat drying. AS a result, as shown in FIG. 10F, light-emitting layers 26*g*, 26*b*, and 26*r* can be evenly formed on the hole injection/transport layers 25. Thus, the functional layers 24*b*, 24*g*, and 24*r* including the hole injection/transport layers 25 and the light-emitting layers 26*g*, 26*b*, and 26*r* are formed.

The method for forming the functional layers 24*b*, 24*g*, and 24*r* in the functional-layer forming step is not limited to the above method. For example, intermediate layers may be formed between the hole injection/transport layers 25, which are based on PEDOT/PSS, and the light-emitting layers 26*g*, 26*b*, and 26*r*, which are based on PF. An example of a liquid containing an intermediate-layer forming material is one containing cyclohexylbenzene as a solvent and a triphenylamine-based polymer in an amount of about 0.1% by weight as the intermediate-layer forming material.

The intermediate layers function to facilitate transportation (injection) of holes into the light-emitting layers 26*g*, 26*b*, and 26*r* and to inhibit electrons from entering the hole injection/transport layers 25 from the light-emitting layers 26*g*, 26*b*, and 26*r*. That is, the intermediate layers improve the efficiency of light emission through recombination of electrons and holes in the light-emitting layers 26*g*, 26*b*, and 26*r*.

Figure 10G:
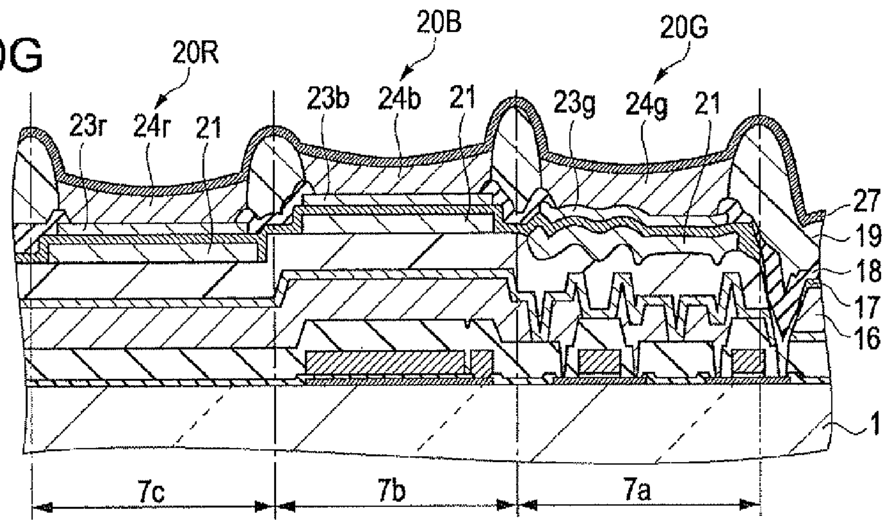

In the common-electrode forming step, as shown in FIG. 10G, the common electrode 27 is formed so as to cover the partitioning portion 19 and the functional layers 24*b*, 24*g*, and 24*r*. Thus, the organic EL elements 20 are completed.

As the material of the common electrode 27, preferably, ITO is used in combination with a metal such as calcium, barium, or aluminum or a fluoride such as LiF. In particular, it is preferable to form a calcium, barium, or LiF film, which has a low work function, on the side closer to the functional layers 24*b*, 24*g*, and 24*r* and to form an ITO film, which has a high work function, on the farther side. It is also possible to form a protective layer of, for example, $SiO_2$ or SiN on the common electrode 27. The protective layer prevents oxidation of the common electrode 27. The common electrode 27 is formed by, for example, evaporation, sputtering, or CVD. In particular, evaporation is preferred in that heat damage to the functional layers 24*b*, 24*g*, and 24*r* can be avoided.

Next, the sealing substrate is bonded to the element substrate 1 on which the emission control units Lu and the organic EL elements 20 are formed. Thus, the organic EL device 10 is completed.

The above method for producing the organic EL device 10 allows high-yield formation of the functional layers 24*b*, 24*g*, and 24*r* having nearly the same planar area contributing to light emission and reduced variations in thickness. That is, the above method allows high-yield production of the top-emission organic EL device 10 that achieves a balance in luminance between different emission colors with reduced variations in luminance.

Second Embodiment

Figure 11:
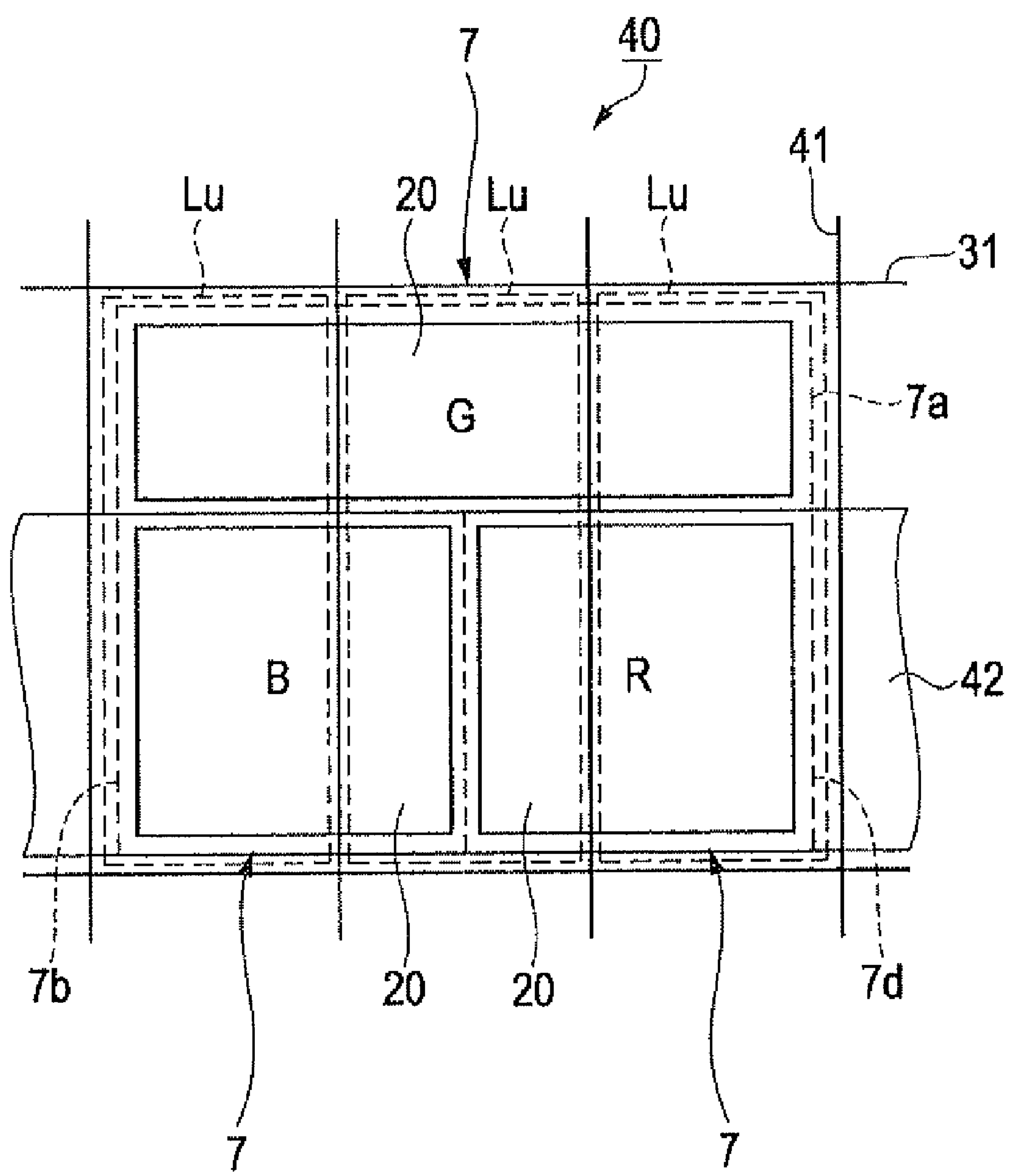
FIG. 11 is a schematic plan view of an organic EL device according to a second embodiment of the invention.

Next, an organic EL device according to a second embodiment of the invention will be described with reference to FIG. 11. FIG. 11 is a schematic diagram showing the pixel structure of the organic EL device according to the second embodiment. The same portions as those of the organic EL device 10 according to the first embodiment are denoted by the same reference numerals.

Referring to FIG. 11, an organic EL device 40 according to this embodiment includes scan lines 31 and data lines 41 arranged in a grid pattern and insulated from each other and power lines 42 disposed along the individual scan lines 31. The organic EL device 40 has emission control units Lu in regions defined by the scan lines 31 and the data lines 41. That is, the structure and arrangement of the emission control units Lu are the same as those of the organic EL device 10.

Depending on steps (level or state of surface irregularities) over the drive circuit sections formed on the substrate, each region extending over three emission control units Lu adjacent along the scan lines 31 is separated into a first film-formation region 7*a* including semiconductor elements (TFTs 11 and 12) and two film-formation regions including hold capacitors, namely, a second film-formation region 7*b* and a fourth film-formation region 7*d*.

The first film-formation region 7*a* extends across the three emission control units Lu. The second film-formation region 7*b* extends across the leftmost and central emission control units Lu. The fourth film-formation region 7*d* extends across the central and rightmost emission control units Lu.

The second and fourth film-formation regions 7*b* and 7*d*, which are square, have nearly the same planar area as the first film-formation region 7*a*, which is substantially rectangular.

An organic EL element 20G serving as an emission unit that emits green light is provided in the first film-formation region 7*a* to constitute a light-emitting pixel 7. An organic EL element 203 serving as an emission unit that emits blue light is provided in the second film-formation region 7*b* to constitute a light-emitting pixel 7. An organic EL element 20R serving as an emission unit that emits red light is provided in the fourth film-formation region 7*d* to constitute a light-emitting pixel 7.

A top-emission structure including reflective layers allows relatively flexible arrangement of the drive circuit sections because they are formed below the reflective layers. As shown in FIG. 11, therefore, if the hold capacitors and dummy wiring layers for reducing steps are formed in the region where the power line 42 is disposed, the second and fourth film-formation regions 7*b* and 7*d* can be defined in step regions at nearly the same level.

Thus, the arrangement of the light-emitting pixels 7 that emit light of different colors is not limited to a stripe pattern, as in the organic EL device 10 according to the first embodiment; a pseudo-delta pattern, as in the organic EL device 40 according to the second embodiment, can also be used.

The organic EL device 40 can be produced by the same method as the organic EL device 10 according to the first embodiment, where pixel electrodes and a partitioning portion separating the pixel electrodes are formed in the pattern corresponding to the film-formation regions 7*a*, 7*b*, and 7*d*.

Third Embodiment

Next, organic EL devices serving as first to fourth examples of a third embodiment of the invention and methods for producing the organic EL devices will be described. The same portions as those of the organic EL device 10 according to the first embodiment are denoted by the same reference numerals.

First Example

Organic EL Device

Figure 12:
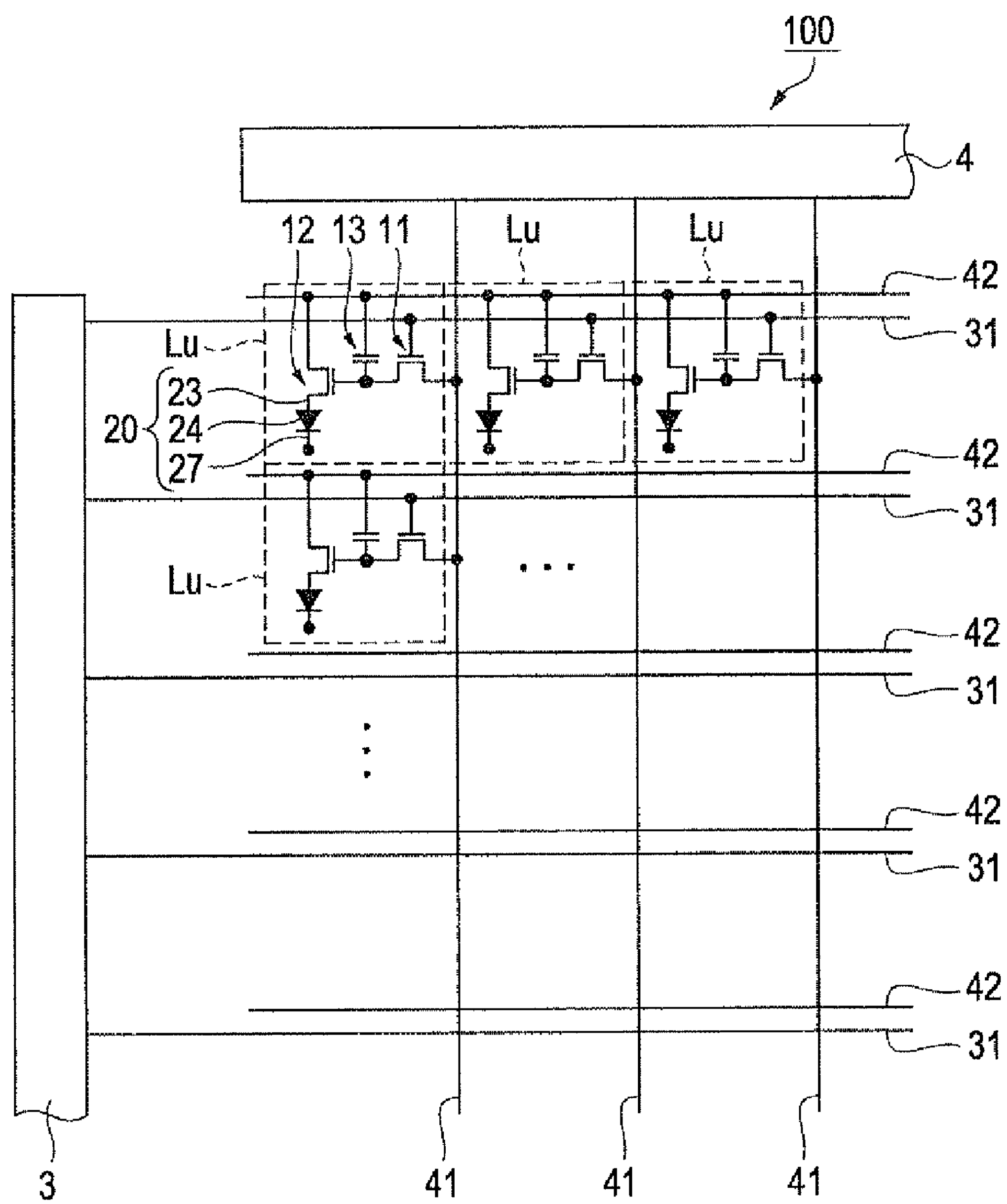
FIG. 12 is an equivalent circuit diagram showing the electrical configuration of an organic EL device serving as a first example of a third embodiment according to the invention.
Figure 13:
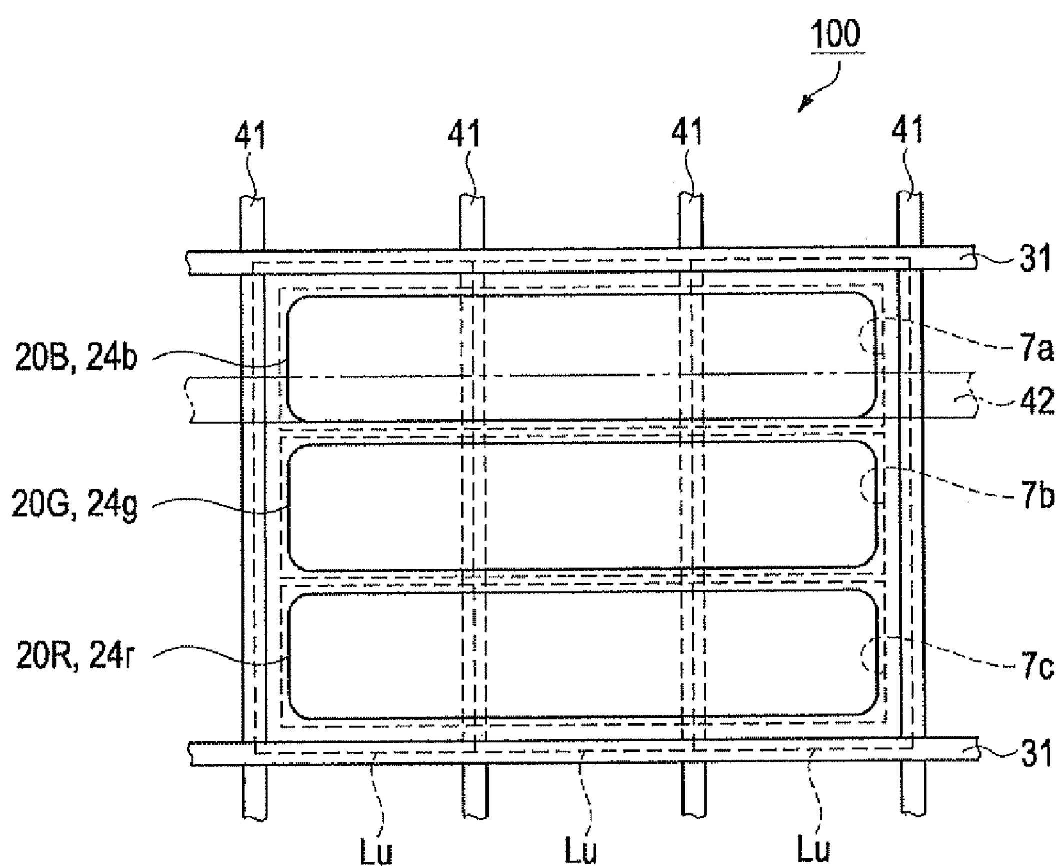
FIG. 13 is a schematic plan view showing the arrangement of emission units and emission control units in the first example of the third embodiment.
Figure 14:
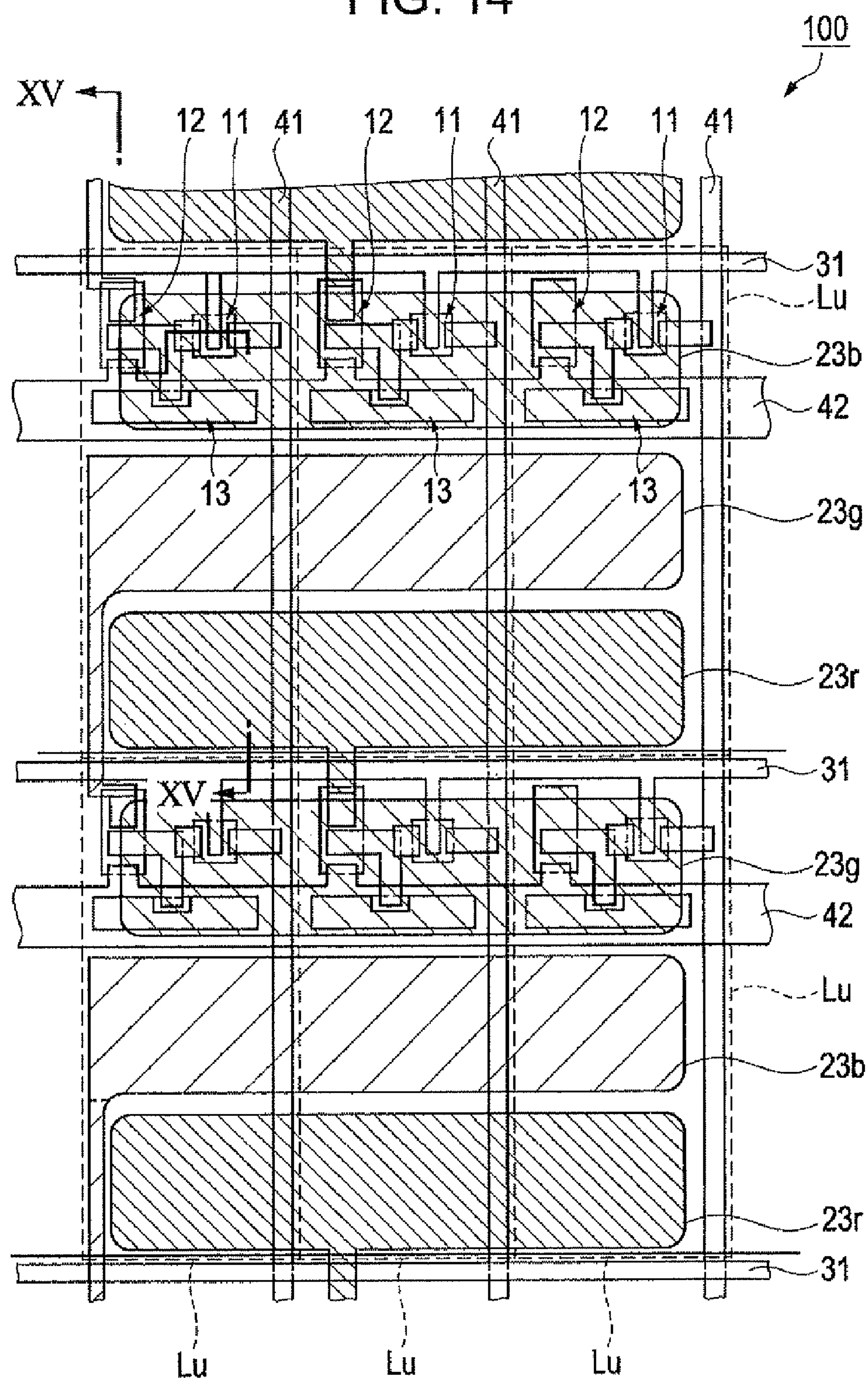
FIG. 14 is a schematic plan view showing drive circuit sections in the emission control units in the first example of the third embodiment.
Figure 15:
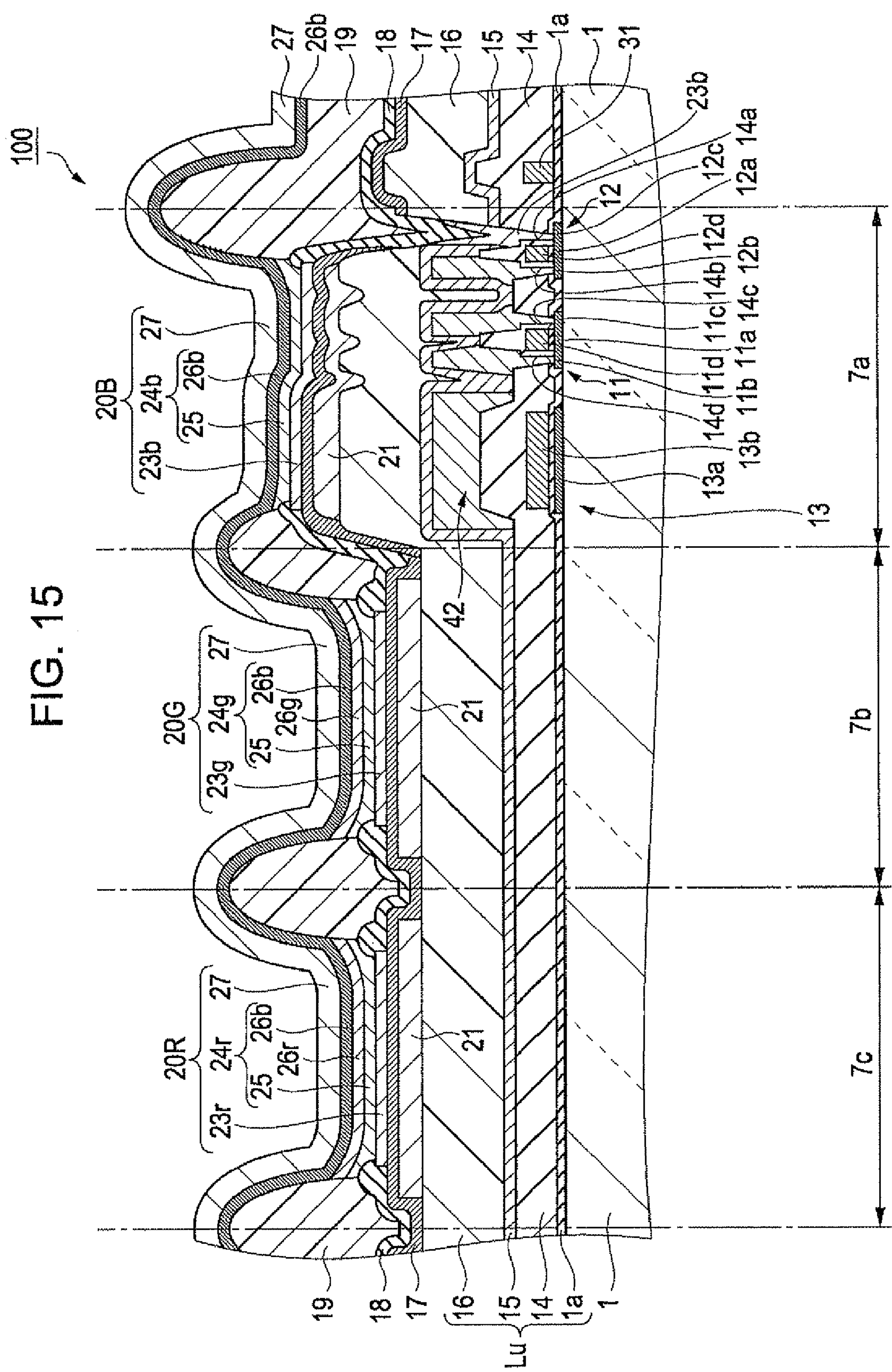
FIG. 15 is a schematic sectional view taken along line XV-XV of FIG. 14, showing the emission units and the emission control units in the first example of the third embodiment.

FIG. 12 is an equivalent circuit diagram showing the electrical configuration of the organic EL device serving as the first example. FIG. 13 is a schematic plan view showing the arrangement of emission units and emission control units in the first example. FIG. 14 is a schematic plan view showing drive circuit sections in the emission control units in the first example. FIG. 15 is a schematic sectional view taken along line XV-XV of FIG. 14, showing the emission units and the emission control units in the first example.

Referring to FIG. 12, an organic EL device 100 serving as the first example is an active-matrix display device including TFTs serving as switching elements for driving organic EL elements 20 serving as the emission units.

The organic EL device 100 includes scan lines 31 connected to a scan-line drive section 3, data lines 41 connected to a data-line drive section 4, and power lines 42 disposed parallel to the individual scan lines 31. Emission of light from the organic EL elements 20 is controlled by emission control units Lu disposed in regions defined by the scan lines 31 and the data lines 41, which are insulated from and cross each other.

The emission control units Lu include drive circuit sections including switching TFTs 11 whose gate electrodes are supplied with scan signals via the scan lines 31, hold capacitors 13 that hold pixel signals supplied from the data lines 41 via the TFTs 11, and drive TFTs 12 whose gate electrodes are supplied with the pixel signals held by the hold capacitors 13.

The organic EL elements 20, serving as the emission units, include pixel electrodes 23 into which a drive current flows from the power lines 42 when the pixel electrodes 23 are electrically connected to the power lines 42 via the drive TFTs 12 and functional layers 24 held between the pixel electrodes 23 and a common electrode 27.

The scan lines 31 and the data lines 41 connected to the TFTs 11 and 12 are collectively referred to as signal lines.

When the scan lines 31 are driven to switch the switching TFTs 11 on, the potentials of the data lines 41 at that moment are held by the hold capacitors 13. The state of the hold capacitors 13 determines the on/off state of the drive TFTs 12. A current flows from the power lines 42 into the pixel electrodes 23 via the drive TFTs 12 and then flows into the common electrode 27 via the functional layers 24, which emit light depending on the current flowing therethrough.

Next, the arrangement of the individual components on the substrate in the organic EL device 100 will be described with reference to FIGS. 13 and 14.

Referring to FIG. 13, the emission control units Lu are provided in the regions defined by the scan lines 31 and the data lines 41, which are arranged in a grid pattern and are insulated from each other. The emission control units Lu include the TFTs 11 and 12, the hold capacitors 13, and wiring lines connected thereto.

Each region extending over three emission control units Lu adjacent along the scan lines 31 is separated into three substantially rectangular regions having nearly the same planar area; they are referred to as, from top to bottom, a first film-formation region 7*a*, a second film-formation region 7*b*, and a third film-formation region 7*c*.

An organic EL element 20B including a functional layer 24*b* that emits blue (B) light is disposed as a first organic EL element in the first film-formation region 7*a*. An organic EL element 20G including a functional layer 24*g* that emits green (G) light is disposed as a second organic EL element in the second film-formation region 7*b*. An organic EL element 20R including a functional layer 24*r* that emits red (R) light is disposed as a third organic EL element in the third film-formation region 7*c*. In other words, the three organic EL elements 20B, 20G, and 20R are provided as emission units that emit light of different colors so as to extend across the same number of (three) emission control units Lu adjacent along the scan lines 31.

The three organic EL elements 20B, 20G, and 20R constitute one display unit, and a plurality of display units are arranged in a matrix on the substrate. The organic EL elements 20B, 20G, and 20R are also referred to as the organic EL elements 20 to describe the common features thereof.

The power line 42 is disposed along the scan lines 31 so as to extend across the first film-formation regions 7*a* of the adjacent display units.

Specifically, as shown in FIG. 14, the TFTs 11 and 12 are disposed near intersections of the scan lines 31 and the data lines 41. The TFTs 11 and 12 have wiring lines connected to the scan lines 31, the data lines 41, and the hold capacitors 13 and wiring lines connecting together the TFTs 11 (drains) and the TFTs 12 (gates).

The TFTs 12 have one (source) of the three terminals (gate, source, and drain) connected to the power line 42 to control the current flowing from the power line 42 into the organic EL elements 20 and has a larger planar area than the TFTs 11 for switching the organic EL elements 20 for sufficient withstand current and voltage.

The hold capacitors 13 are substantially rectangular in plan view, are disposed near the TFTs 11 and 12, and account for about one sixth the planar area of the emission control units Lu. The electrical capacitance of the hold capacitors 13 is determined depending on the frame frequency of scan signals, off-state current leakage from the drive TFTs 12, and the luminous characteristics of the organic EL elements 20. Accordingly, the planar area of the hold capacitors 13 is actually determined by setting appropriate electrical capacitance.

The pixel electrode 23*b* of the organic EL element 20B that emits blue (B) light is disposed over the region where the TFTs 11 and 12 and the hold capacitors 13 of the three adjacent emission control units Lu are disposed, namely, the first film-formation region 7*a*. Of the three emission control units Lu arranged along the scan lines 31, the pixel electrode 23*b* is connected to the TFT 12 (drain) of the rightmost emission control unit Lu.

The pixel electrode 23*g* of the organic EL element 20G that emits green (G) light is disposed over the second film-formation region 7*b*, which extends across the three adjacent emission control units Lu. Of the three emission control units Lu arranged along the scan lines 31, the pixel electrode 23*g* is connected to the TFT 12 (drain) of the leftmost emission control unit Lu.

The pixel electrode 23*r* of the organic EL element 20R that emits red (R) light is disposed over the third film-formation region 7*c*, which extends across the three adjacent emission control units Lu. Of the three emission control units Lu arranged along the scan lines 31, the pixel electrode 23*r* is connected to the TFT 12 (drain) of the central emission control unit Lu.

For convenience of wiring, the pixel electrodes 23*g* and 23*r* are actually connected to the TFTs 12 (drains) of other emission control units Lu adjacent along the data lines 41 to the three emission control units Lu adjacent along the scan lines 31, although the method for connecting the pixel electrodes 23*b*, 23*g*, and 23*r* and the TFTs 12 are not limited thereto.

Next, the structure of the organic EL device 100 in the thickness direction will be described with reference to FIG. 15.

Referring to FIG. 15, the emission control units Lu and the organic EL elements 20 of the individual emission colors (separately referred to as organic EL elements 20B, 20G, and 20R) are stacked on an element substrate 1 serving as the substrate. The emission control units Lu are included in a base layer below the organic EL elements 20, which serve as the emission units. In other words, the organic EL elements 20B, 20G, and 20R are disposed on the base layer including the emission control units Lu.

In this example, the base layer includes the element substrate 1, the emission control units Lu, reflective layers 21, and an insulating film 17.

The element substrate 1 used is a transparent substrate of, for example, glass or resin, or a nontransparent substrate of, for example, silicon. Semiconductor layers 11*a*, 12*a*, and 13*a* formed of, for example, polysilicon films are arranged in an island-like pattern on the surface of the element substrate 1. The semiconductor layer 11*a* constitutes the TFT 11, whereas the semiconductor layer 12*a* constitutes the TFT 12. The semiconductor layer 13*a* constitutes an electrode of the hold capacitor 13; therefore, it is also referred to as the electrode 13*a*. The semiconductor layers 11*a*, 12*a*, and 13*a* have a thickness of about 50 nm.

A gate insulating film 1*a* is disposed so as to cover substantially the entire surface of the element substrate 1 excluding the edges and gates of the island-like semiconductor layers 11*a* and 12*a* and part of the semiconductor layer 13*a*. A portion of the gate insulating film 1*a* covering the semiconductor layer 13*a* functions as a dielectric layer. The gate insulating film 1*a* has a thickness of about 50 to 100 nm.

The scan lines 31, the data lines 41 (not shown), and gate electrodes 11*d* and 12*d* of the TFTs 11 and 12 are formed on the gate insulating film 1*a* by providing and patterning a low-resistance metal wiring layer of, for example, aluminum, tantalum, tungsten, or a metal compound thereof. The low-resistance metal wiring layer also forms the other electrode 13*b* of the hold capacitor 13 and a wiring line (not shown) connected to the electrode 13*a* thereof. An interlayer insulating film 14 is disposed so as to cover the components described above. The low-resistance metal wiring layer has a thickness of about 500 to 600 nm. Similarly, the interlayer insulating film 14 has a thickness of about 500 to 600 nm.

The interlayer insulating film 14 has contact holes 14*a*, 14*b*, 14*c*, and 14*d* for connection to the sources and drains of the TFTs 11 and 12 and also has contact holes (not shown) for connecting the hold capacitor 13 to the power line 42 and the TFT 12.

The power line 42 and other wiring lines such as for connection to the power line 42 and via the contact holes 14*b*, 14*c*, and 14*d* are formed on the interlayer insulating film 14 by providing and patterning a low-resistance metal wiring layer of, for example, aluminum, tantalum, tungsten, or a metal compound thereof. The low-resistance metal wiring layer has a thickness of about 500 to 600 nm.

A protective film 15 is disposed so as to cover the power line 42 and the interlayer insulating film 14, and a planarizing layer 16 is disposed so as to cover the protective film 15. The gate insulating film 1*a*, the interlayer insulating film 14, and the protective film 15 are formed of, for example, a silicon compound such as SiN, SiO, or $SiO_2$ or an inorganic mixture thereof. The protective film 15 has a thickness of about 200 to 300 nm. The planarizing layer 16 is formed of, for example, an organic resin such as an acrylic or epoxy resin and has a thickness of about 1 to 2 μm.

Despite the formation of the planarizing layer 16, which is thicker than the low-resistance metal wiring layer and the interlayer insulating film 14, the planarizing layer 16 on the element substrate 1 has surface irregularities. In particular, the planarizing layer 16 has more surface irregularities in the first film-formation region 7*a*, where the TFTs 11 and 12 are disposed, than in the second film-formation region 7*b* and the third film-formation region 7*c* because the contact holes 14*a*, 14*b*, 14*c*, and 14*d* and the wiring lines for connection to the TFTs 11 and 12 are formed.

In this case, the surface irregularity of the planarizing layer 16 is highest in the first film-formation region 7*a*, where the TFTs 11 and 12, the hold capacitors 13, and the low-resistance metal wiring layer segments connected thereto are disposed, and is lower in the second and third film-formation regions 7*b* and 7*c*, where the TFTs 11 and 12 and the hold capacitors 13 are not disposed.

The surface irregularity can be defined by the arithmetic average roughness (Ra) of the surface of the planarizing layer 16 or the standard deviation of the height of the surface of the planarizing layer 16 from that of a reference plane, or can also be defined by the standard deviation of the luminance distribution within the pixels during light emission.

The planarizing layer 16 has surface steps with heights of several tens to hundreds of nanometers in the first film-formation region 7*a*. In contrast, the planarizing layer 16 has almost no surface steps in the second and third film-formation regions 7*b* and 7*c* in the sectional view of FIG. 15. Although steps are formed over the data lines 41 because the second and third film-formation regions 7*b* and 7*c* are separated so as to extend across the data lines 41 between the adjacent emission control units Lu, as shown in FIG. 14, these steps are negligible.

In each region including three adjacent emission control units Lu, the organic EL elements 20B, 20G, and 20R of different emission colors are arranged above the base layer on the element substrate 1 depending on the steps on the base layer. Specifically, the organic EL element 20B is disposed in the first film-formation region 7*a*, the organic EL element 20G is disposed in the second film-formation region 7*b*, and the organic EL element 20R is disposed in the third film-formation region 7*c*.

The organic EL element 20B disposed in the first film-formation region 7*a* includes the reflective layer 21, the insulating film 17, the pixel electrode 23*b*, the functional layer 24*b*, and the common electrode 27, which are stacked on the planarizing layer 16 in the above order. The other organic EL elements 20G and 20R are similar to the organic EL element 20B.

The reflective layers 21 and the insulating film 17 are unnecessary if the pixel electrodes 23 are formed of a reflective material. In this case, the basic structure of the organic EL elements 20 includes the pixel electrodes 23, the functional layers 24, and the common electrode 27.

The reflective layers 21 are formed of, for example, a reflective metal material such as Al—Nd and have a thickness of about 50 to 100 nm. The insulating film 17 covering the reflective layers 21 is formed of a transparent inorganic material such as SiN or SiO and has a thickness of about 50 to 100 nm. The pixel electrodes 23*b*, 23*g*, and 23*r* are formed of transparent conductive films such as ITO or IZO films and have a thickness of about 50 to 100 nm.

The pixel electrodes 23*b*, 23*g*, and 23*r* are substantially defined by an insulating film 18 disposed so as to cover the edges of the pixel electrodes 23*b*, 23*g*, and 23*r* and a partitioning portion 19 disposed on the insulating film 18. The insulating film 18 is formed of an inorganic insulating material such as $SiO_2$ and has a thickness of about 50 to 100 nm. The partitioning portion 19 is formed of a resin material such as a phenolic or polyimide resin and has a thickness (height) of about 1 to 2 μm.

The functional layer 24*g* includes a light-emitting layer 26*g* serving as a second light-emitting layer, and the functional layer 24*r* includes a light-emitting layer 26*r* serving as a third light-emitting layer. The light-emitting layers 26*g* and 26*r* are formed by application, in which liquids containing functional materials are applied into the second and third film-formation regions 7*b* and 7*c*, substantially defined by the partitioning portion 19, and the applied liquids are dried.

The functional layer 24*b* includes a light-emitting layer 26*b* serving as a first light-emitting layer. The light-emitting layer 26*b* is formed by evaporation, in which a functional material is evaporated and deposited in the first film-formation region 7*a*. The light-emitting layer 26*b* is formed so as to cover the adjacent second and third film-formation regions 7*b* and 7*c* (light-emitting layers 26*g* and 26*r*) and the partitioning portion 19.

The functional layers 24*b*, 24*g*, and 24*r* also include hole injection/transport layers 25 between the pixel electrodes 23*b*, 23*g*, and 23*r* and the light-emitting layers 26*b*, 26*g*, and 26*r*, respectively. The hole injection/transport layers 25 are formed by application. The details will be shown later in the description of a method for producing the organic EL device 100.

The common electrode 27 is disposed so as to cover the partitioning portion 19 and the functional layers 24*b*, 24*g*, and 24*r*. The common electrode 27 is formed of a transparent conductive film such as an ITO or IZO film and has a thickness of about 50 to 100 nm.

A sealing substrate (not shown), such as a transparent glass substrate, is bonded to the element substrate 1, on which the light-emission control units Lu and the organic EL elements 20B, 20G, and 20R are disposed, to seal the element substrate 1 so that external moisture and gases such as oxygen do not intrude into the functional layers 24*b*, 24*g*, and 24*r*.

The organic EL device 100 is a full-color display device having a top-emission structure in which the reflective layers 21 reflect light emitted from the functional layers 24*b*, 24*g*, and 24*r* to output the light from the sealing substrate side. Because the emission control units Lu are disposed below the reflective layers 21, the light emitted from the functional layers 24*b*, 24*g*, and 24*r* is not blocked by the components of the drive circuit sections, including the TFTs 11 and 12, the hold capacitors 13, and the wiring lines connected thereto (such as the scan lines 31, the data lines 41, and the power lines 42). Thus, the top-emission structure allows relatively flexible arrangement of the components of the drive circuit sections on the element substrate 1. The structure of the organic EL elements 20B, 20G, and 20R, however, is not limited thereto; for example, an optical resonator structure may be introduced between the functional layers 24*b*, 24*g*, and 24*r* and the reflective layers 21 to improve luminance for each emission color.

Method for Producing Organic EL Device

Figure 16:
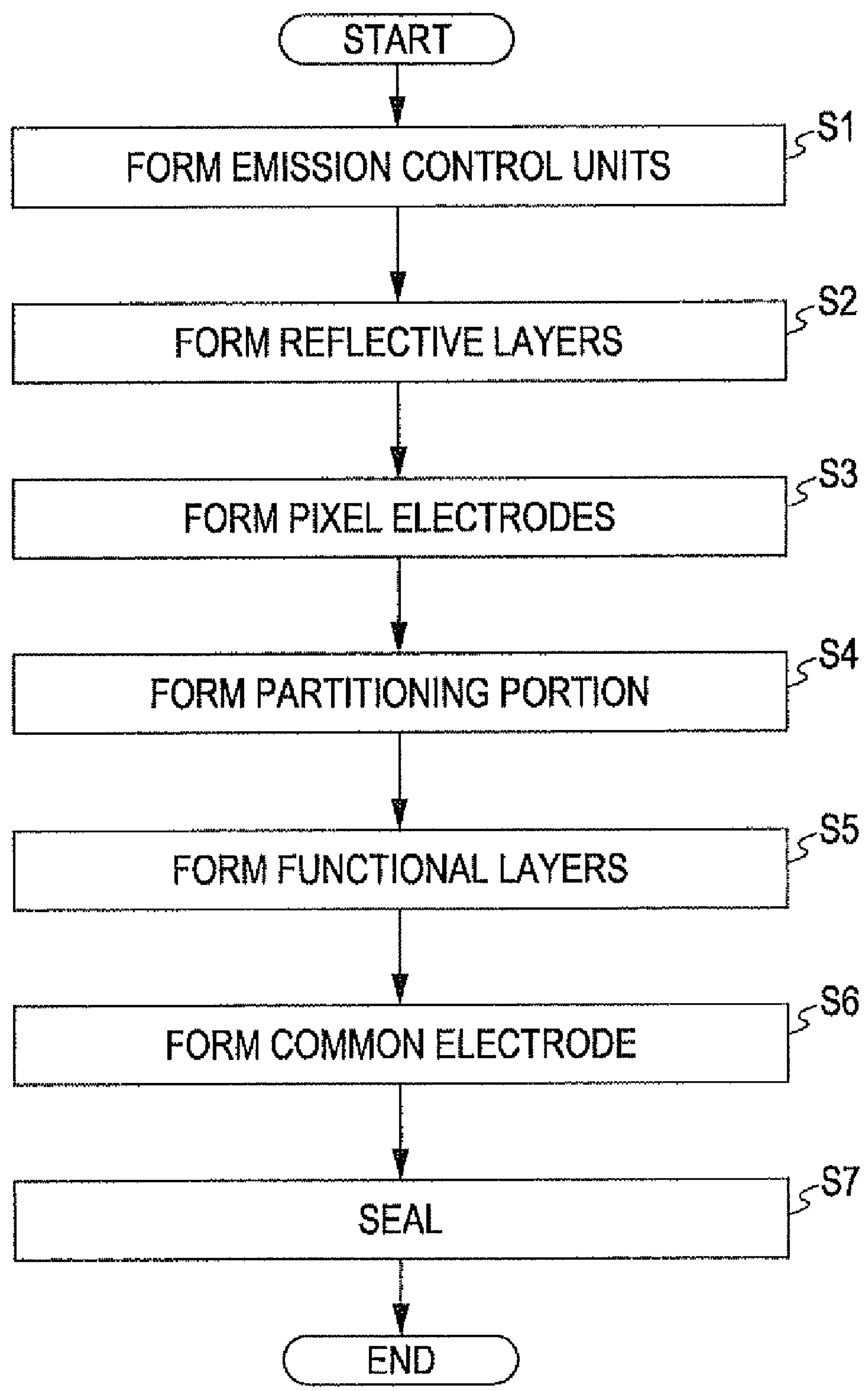
FIG. 16 is a flowchart illustrating a method for producing the organic EL device serving as the first example of the third embodiment.
Figure 17C:
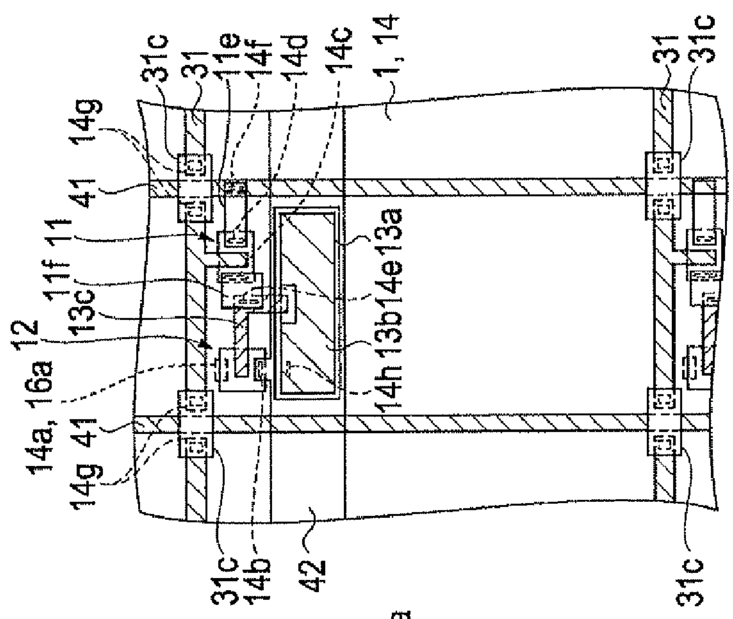
FIGS. 17A to 17C are schematic plan views illustrating the method for producing the organic EL device serving as the first example of the third embodiment.
Figure 17B:
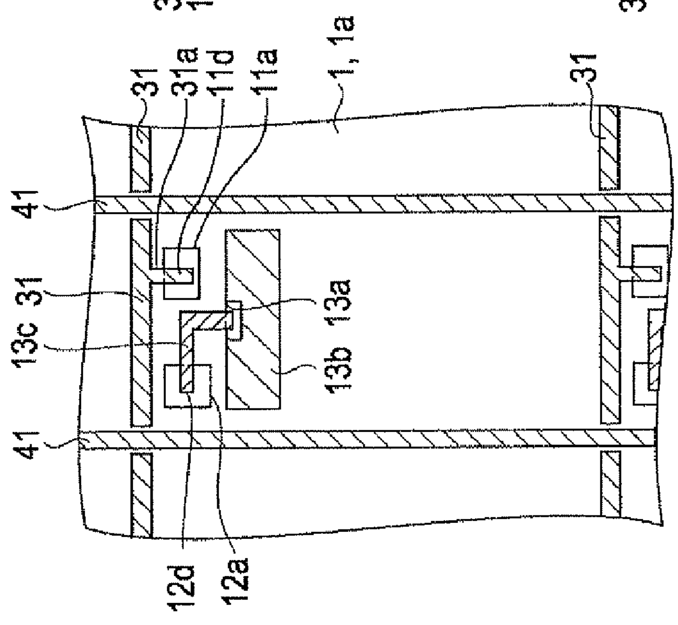
Figure 17A:
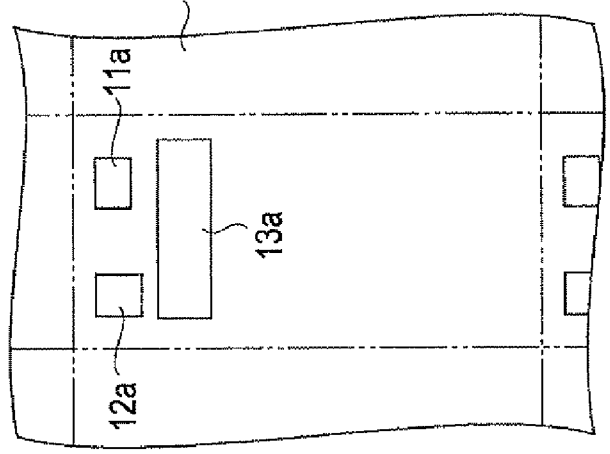

Next, a method for producing the organic EL device 100 serving as the first example will be described with reference to FIGS. 16, 17A to 17C, 18D to 18F, and 19G to 19I. FIG. 16 is a flowchart illustrating the method for producing the organic EL device 100. FIGS. 17A to 17C are schematic plan views illustrating the method for producing the organic EL device 100. FIGS. 18D to 18F and 19G to 19I are schematic sectional views illustrating the method for producing the organic EL device 100.

Referring to FIG. 16, the method for producing the organic EL device 100 serving as the first example includes an emission-control-unit forming step (Step S1) of forming the emission control units Lu on the element substrate 1; a reflective-layer forming step (Step S2) of separating each region including three adjacent emission control units Lu on the surface of the base layer into three film-formation regions and forming the reflective layers 21 in the individual film-formation regions; a pixel-electrode forming step (Step S3) of forming the pixel electrodes 23*b*, 23*g*, and 23*r* in the individual film-formation regions so as to be electrically connected to the emission control units Lu; a partitioning-portion forming step (Step S4) of forming the partitioning portion 19 so as to define the three film-formation regions; a functional-layer forming step (Step S5) of forming the functional layers 24b, 24g, and 24r on the pixel electrodes 23b, 23g, and 23r, respectively; a common-electrode forming step (Step S6) of forming the common electrode 27 so as to cover the partitioning portion 19 and the functional layers 24b, 24g, and 24r; and a sealing step (Step S7) of sealing the element substrate 1 by bonding the sealing substrate. An organic-EL-element forming step in the first example includes at least the reflective-layer forming step, the pixel-electrode forming step, the functional-layer forming step, and the common-electrode forming step.

In the emission-control-unit forming step (drive-circuit forming step) of Step S1, as shown in FIG. 17A, a polysilicon film is formed on the element substrate 1 and is patterned by photolithography to form the semiconductor layers 11a, 12a, and 13a in an island-like pattern. The polysilicon film has a thickness of about 50 nm. The polysilicon film can be formed by a known technique such as low-pressure CVD.

The gate insulating film 1a is then formed so as to cover the element substrate 1 after masking the source and drain sides of the semiconductor layers 11a and 12a, which correspond to the TFTs 11 and 12, respectively, and electrical connection portions of the semiconductor layers 13a. The gate insulating film 1a is formed by, for example, sputtering in a vacuum using SiN or SiO as a target so as to have a thickness of about 50 to 100 nm.

Next, a low-resistance metal film such as an aluminum film is formed on the gate insulating film 1a by, for example, sputtering so as to have a thickness of about 500 to 600 nm. The metal film is patterned by photolithography to form the scan lines 31, the data lines 41, wiring lines 31a extending from the scan lines 31 to the tops of the semiconductor layers 11a to constitute the gate electrodes 11d, wiring lines 13c (including the gate electrodes 12d) extending from the tops of the semiconductor layers 12a to the connection portions of the semiconductor layers 13a, and the electrodes 13b of the hold capacitors 13, as shown in FIG. 17B. The scan lines 31, extending perpendicularly to the data lines 41, are temporarily formed so as to be cut away from around the data lines 41.

Next, the interlayer insulating film 14 is formed so as to cover substantially the entire surface of the element substrate 1. The interlayer insulating film 14 is formed by, for example, sputtering in a vacuum using SiN or Sip as a target so as to have a thickness of about 500 to 600 nm. Regions where wiring lines excluding the power lines 42 are to be formed are masked in advance with, for example, a photosensitive resin material. The masked regions can be removed after the formation of the interlayer insulating film 14, thus forming the contact holes 14a, 14b, 14c, 14d, 14e, 14f, 14g, and 14h, as shown in FIG. 17C.

Next, a low-resistance metal film such as an aluminum film is formed on the interlayer insulating film 14 by, for example, sputtering so as to have a thickness of about 500 to 600 nm. The metal film is patterned by photolithography to form the power lines 42 and various wiring lines, as shown in FIG. 17C. For example, the contact holes 14d and 14f can be filled with the low-resistance metal film to form wiring lines 11e connecting together the data lines 41 and the sources of the TFTs 11. The contact holes 14c and 14e can be filled with the low-resistance metal film to form wiring lines 11f connecting together the drains of the TFTs 11 and the gates of the TFTs 12. The gaps between the pairs of contact holes 14g can be filled with the low-resistance metal film to form wiring lines 31c electrically connecting together the segments of the scan lines 31 over the data lines 41. The contact holes 14b and 14h can be filled with the low-resistance metal film to form wiring lines 12f connecting the power lines 42 to the sources of the TFTs 12 and the electrodes 13b of the hold capacitors 13.

Next, the drive circuit sections thus completed are covered with the protective film 15. The protective film 15 is formed by, for example, sputtering using SiN as a target so as to have a thickness of about 200 to 300 nm. The planarizing layer 16 is then formed so as to cover the protective film 15. The planarizing layer 16 is formed by, for example, applying and solidifying a photosensitive acrylic resin by a method such as spin coating or roll coating so as to have a thickness of about 1 to 2 μm and patterning the coating by photolithography. The patterning is performed mainly to form contact holes 16a communicating with the contact holes 14a for connection between the pixel electrodes 23b, 23g, and 23r and the drains of the TFTs 12. Alternatively, the portions corresponding to the contact holes 16a may be masked before the application of the planarizing-layer forming material.

Figure 18D:
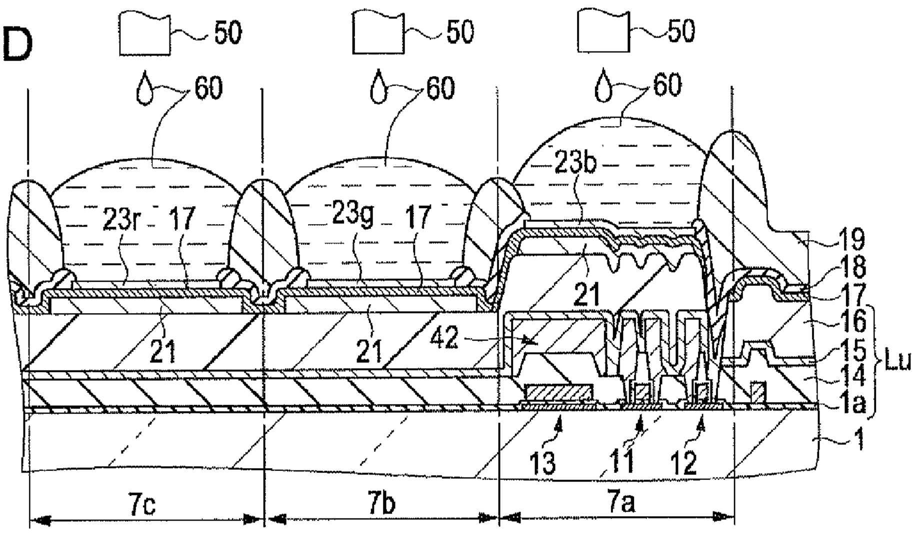
FIGS. 18D to 18F are schematic sectional views illustrating the method for producing the organic EL device serving as the first example of the third embodiment.

Next, in the reflective-layer forming step of Step S2, as shown in FIG. 18D, the reflective layers 21 are formed in the first, second, and third film-formation regions 7a, 7b, and 7c, which are separated depending on steps (level or state of surface irregularities) on the planarizing layer 16. The reflective layers 21 are formed by, for example, depositing the reflective-layer forming material described above, namely, Al—Nd, by sputtering so as to have a thickness of about 50 to 100 nm and patterning the film by photolithography so as to have a slightly larger planar area than the pixel electrodes 23b, 23g, and 23r. The insulating film 17 is then formed so as to cover the reflective layers 21. The insulating film 17 is formed by, for example, sputtering in a vacuum using SiN or SiO as a target so as to have a thickness of about 50 to 100 nm.

In the pixel-electrode forming step of Step S3, as shown in FIG. 18D, an ITO film is formed on the insulating film 17 by, for example, sputtering so as to have a thickness of about 100 nm. The ITO film is then patterned by photolithography to form the pixel electrodes 23b, 23g, and 23r above the reflective layers 21. In addition, the contact holes 16a are filled with the ITO film to connect the pixel electrodes 23b, 23g, and 23r to the TFTs 12 (drains). In this case, the pixel electrodes 23b, 23g, and 23r have nearly the same planar area.

Next, the insulating film 18 is formed so as to cover the edges of the pixel electrodes 23b, 23g, and 23r. The insulating film 18 is formed by, for example, sputtering using SiN or SiO as a target so as to have a thickness of about 50 to 100 nm after masking the portions of the pixel electrodes 23b, 23g, and 23r other than the edges thereof.

In the partitioning-portion forming step of Step S4, subsequently, the partitioning portion 19 is formed on the insulating film 18 by applying and solidifying a phenolic or polyimide photosensitive resin material on the surface of the element substrate 1 so as to have a thickness of about 1 to 2 μm and subjecting the coating to exposure and development. Thus, as shown in FIG. 18D, the partitioning portion 19 substantially defines the first, second, and third film-formation regions 7a, 7b, and 7c. The first, second, and third film-formation regions 7a, 7b, and 7c have nearly the same planar area.

Next, the functional-layer forming step of Step S5 will be described. The functional-layer forming step in the first example includes a hole-injection/transport-layer forming step of forming hole injection/transport layers 25 by applying and solidifying a liquid containing a hole-injection/transport-layer forming material; a first light-emitting-layer forming step of forming the light-emitting layers 26g and 26r of the functional layers 24g and 24r in the film-formation regions other than the first film-formation regions 7a, namely, the second and third film-formation regions 7b and 7c, by application; and a second light-emitting-layer forming step of forming the light-emitting layers 26b of the functional layers 24b in the first film-formation regions 7a by evaporation.

In the hole-injection/transport-layer forming step, as shown in FIG. 18D, ejection heads (ink-jet heads) 50 capable of ejecting liquid from nozzles are used to apply a predetermined amount of liquid 60 containing the hole-injection/transport-layer forming material in the form of droplets into the first, second, and third film-formation regions 7a, 7b, and 7c. The liquid 60 is a solution containing, for example, diethylene glycol and water (pure water) as a solvent and a mixture (PEDOT/PSS) of a polythiophene derivative, such as polyethylenedioxythiophene (PEDOT), and polystyrenesulfonate (PSS), serving as a dopant, in an amount of 0.5% by weight as the hole-injection/transport-layer forming material. The solvent content is adjusted so that the liquid 60 has a viscosity of about 20 mPa·s or less.

Hole-injection/transport-layer forming materials other than PEDOT/PSS include polystyrene, polypyrrole, polyaniline, polyacetylene, and derivatives thereof.

Figure 18E:
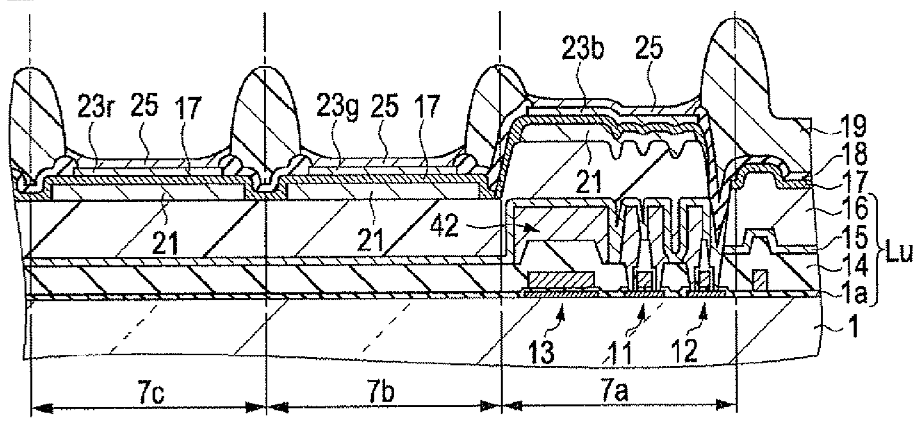

The element substrate 1 onto which the liquid 60 has been applied is heat-dried by a method such as lamp annealing to evaporate the solvent, thus forming the hole injection/transport layers 25 in the first, second, and third film-formation regions 7a, 7b, and 7c, as shown in FIG. 18E. Before the application of the liquid 60, the element substrate 1 may be subjected to surface treatment including lyophilic treatment of the surfaces of the pixel electrodes 23b, 23g, and 23r and liquid-repellent treatment of the surface of the partitioning portion 19. An example of the lyophilic treatment is plasma treatment using oxygen as a treatment gas, whereas an example of the liquid-repellent treatment is plasma treatment using a fluorinated gas as a treatment gas. The above surface treatment allows the applied liquid 60 to spread evenly over the pixel electrodes 23b, 23g, and 23r.

Figure 18F:
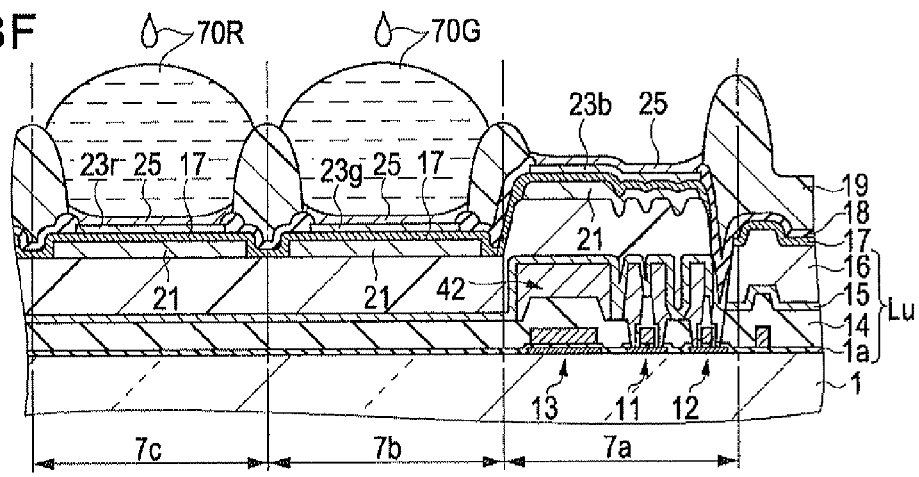

In the first light-emitting-layer forming step, as shown in FIG. 18F, a liquid 70G containing a light-emitting-layer forming material that emits green light and a liquid 70R containing a light-emitting-layer forming material that emits red light are charged into different ejection heads 50 (50G and 50R) and are applied into the second and third film-formation regions 7b and 7c, respectively, in the form of droplets.

The liquids 70G and 70R contain, for example, cyclohexylbenzene as a solvent and polyfluorene derivatives (PF) that emit green and red light in an amount of 0.7% by weight as the light-emitting-layer forming materials. The liquids 70G and 70R have a viscosity of about 14 mPa·s. Light-emitting-layer forming materials other than PF include poly(p-phenylenevinylene) derivatives (PPV), polyphenylene derivatives (PP), poly(p-phenylene) derivatives (PPP), polyvinylcarbazole (PVK), polythiophene derivatives such as PEDOT, and polymethylphenylsilane (PMPS). These polymer materials may be doped with a perylene dye, a coumarin dye, a rhodamine dye, or a low-molecular-weight material such as rubrene, Nile red, coumarin 6, or quinacridone.

Figure 19G:
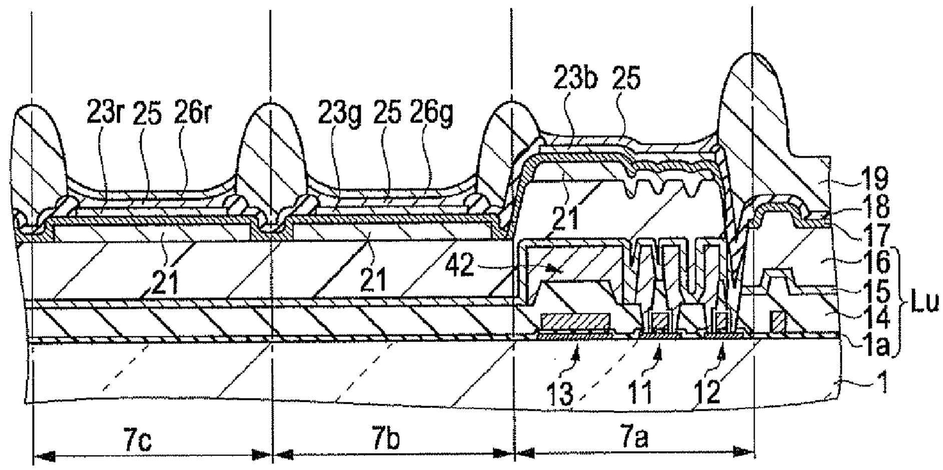
FIGS. 19G to 19I are schematic sectional views illustrating the method for producing the organic EL device serving as the first example of the third embodiment.

The applied liquids 70G and 70R are dried (solidified) by vacuum drying, which evaporates the solvent more evenly than common heat drying. As a result, as shown in FIG. 19G, the light-emitting layers 26g and 26r can be formed on the hole injection/transport layers 25. Thus, the functional layers 24g and 24r including the hole injection/transport layers 25 and the light-emitting layers 26g and 26r are formed. The surface irregularity of the base layer is lower in the second and third film-formation regions 7b and 7c, where the pixel electrodes 23g and 23r are formed, than in the first film-formation region 7a. Accordingly, the liquids 70G and 70R ejected from the ejection heads 50G and 50R spread evenly over the second and third film-formation regions 7b and 7c, thus forming the light-emitting layers 26g and 26r with a thickness of about 80 nm after the drying.

Figure 19H:
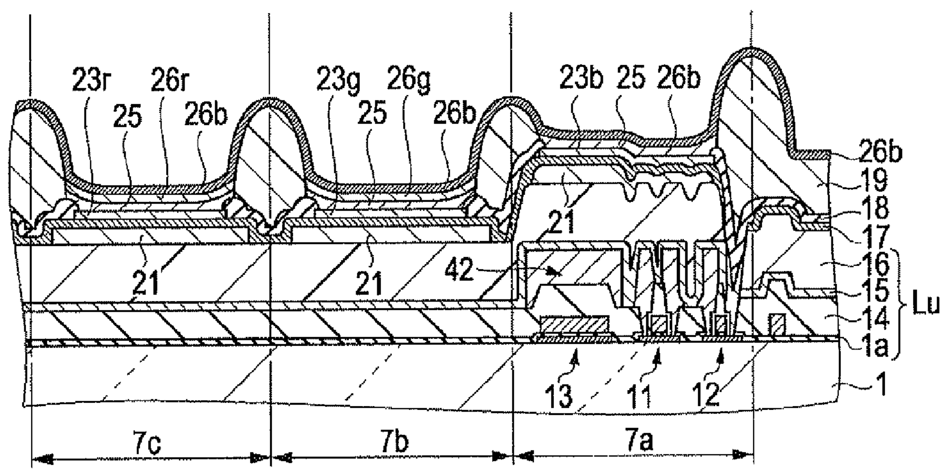

Next, in the second light-emitting-layer forming step, as shown in FIG. 19H, the light-emitting layer 26b is formed on the hole injection/transport layers 25 in the first film-formation regions 7a by evaporation. The light-emitting layer 26b is simultaneously formed over the second and third film-formation regions 7b and 7c. Accordingly, the light-emitting layer 26b is simultaneously stacked on the light-emitting layers 26g and 26r.

The light-emitting-layer forming material used is, for example, a host material, such as CBP, doped with a dopant material such as FIrpic. The light-emitting layer 26b has a thickness of about 50 nm.

Because the light-emitting layer 26b is formed on the hole injection/transport layers 25 by evaporation, it has negligible variations in thickness even in the first film-formation regions 7a, where the base layer has surface steps with heights of several tens to hundreds of nanometers.

Thus, the functional layers 24b including the hole injection/transport layers 25 and the light-emitting layer 26b, the functional layers 24g including the hole injection/transport layers 25, the light-emitting layers 26g, and the light-emitting layer 26b, and the functional layers 24r including the hole injection/transport layers 25, the light-emitting layers 26g, and the light-emitting layer 26b are completed.

The method for forming the functional layers 24b, 24g, and 24r in the functional-layer forming step is not limited to the above method. For example, intermediate layers may be formed between the hole injection/transport layers 25 and the light-emitting layers 26b, 26g, and 26r. An example of a liquid containing an intermediate-layer forming material is one containing cyclohexylbenzene as a solvent and a triphenylamine-based polymer in an amount of about 0.1% by weight as the intermediate-layer forming material.

The intermediate layers function to facilitate transportation (injection) of holes into the light-emitting layers 26b, 26g, and 26r and to inhibit electrons from entering the hole injection/transport layers 25 from the light-emitting layers 26b, 26g, and 26r.

In addition, after the formation of the light-emitting layers 26b, 26g, and 26r, hole-blocking layers and electron transport layers may be formed by evaporation. The hole-blocking layers are formed of, for example, BAlq or BCP, whereas the electron transport layers are formed of, for example, Alq3. The hole-blocking layers function to inhibit holes from leaking from the light-emitting layers 26b, 26g, and 26r. The electron transport layers function to facilitate transportation (injection) of electrons into the light-emitting layers 26b, 26g, and 26r.

That is, the intermediate layers, the hole-blocking layers, and the electron transport layers improve the efficiency of light emission through recombination of electrons and holes in the light-emitting layers 26b, 26g, and 26r.

Figure 19I:
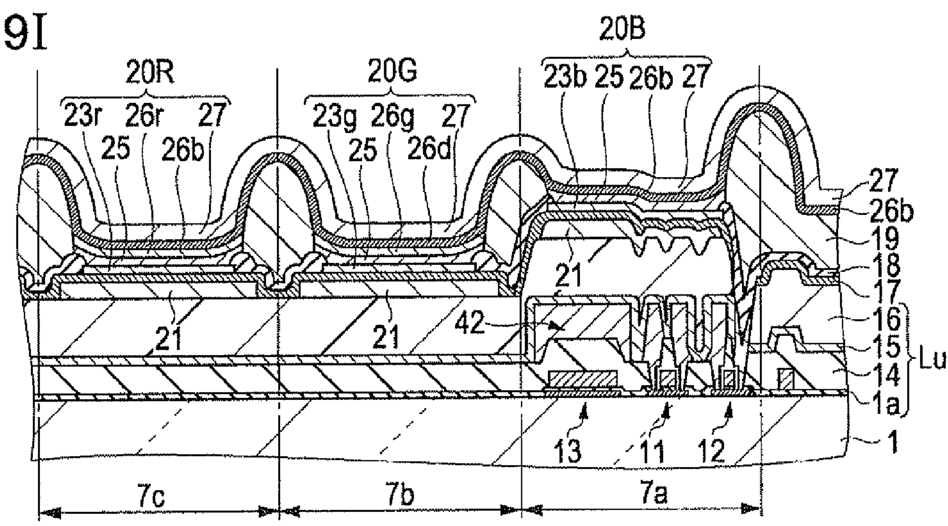

Next, in the common-electrode forming step of Step S6, as shown in FIG. 19I, the common electrode 27 is formed so as to cover the light-emitting layer 26b formed over the first, second, and third film-formation regions 7a, 7b, and 7c. Thus, the organic EL elements 20B, 20G, and 20R are completed.

As the material of the common electrode 27, preferably, ITO is used in combination with a metal such as calcium, barium, or aluminum or a fluoride such as LiF. In particular, it is preferable to form a calcium, barium, or LiF film, which has a low work function, on the side closer to the functional layers 24b, 24g, and 24r and to form an ITO film, which has a high work function, on the farther side. It is also possible to form a protective layer of, for example, $SiO_2$ or SiN on the common electrode 27. The protective layer prevents oxidation of the common electrode 27. The common electrode 27 is formed by, for example, evaporation, sputtering, or CVD. In particular, evaporation is preferred in that heat damage to the functional layers 24*b*, 24*g*, and 24*r* can be avoided.

Next, in the sealing step of Step S7, the sealing substrate is bonded to the element substrate 1 on which the emission control units Lu and the organic EL elements 20 are formed, thus completing the organic EL device 100. For example, the sealing substrate is bonded to the element substrate 1 with a space therebetween by applying an adhesive so as to surround the light-emitting elements 20 or by filling the space with a transparent resin.

The above method for producing the organic EL device 100, which uses application and evaporation in combination, allows the light-emitting layers 26*b*, 26*g*, and 26*r* to be more efficiently formed with reduced variations in thickness while eliminating the need for an evaporation mask than the method in which all the light-emitting layers 26*b*, 26*g*, and 26*r* are selectively formed by evaporation in the first, second, and third film-formation regions 7*a*, 7*b*, and 7*c*, which have nearly the same planar area. That is, the above method allows implementation and efficient production of the top-emission full-color organic EL device 100 that achieves a balance in luminance between different emission colors with reduced variations in luminance.

Although the light-emitting layer 26*b* is simultaneously formed over the light-emitting layers 26*g* and 26*r* in the first example, it may be formed only in the first film-formation regions 7*a* by evaporation using a mask shielding the region other than the first film-formation regions 7*a*.

The light-emitting layer 26*b* may also be formed by another method such as spin coating or dip coating. In this case, the light-emitting layer 26*b* can be formed with negligible variations in thickness even if the base layer has surface steps with heights of several tens to hundreds of nanometers. In other words, the light-emitting layers 26*b*, 26*g*, and 26*r* may be formed by selecting different methods depending on the surface irregularity of the base layer in the film-formation regions 7*a*, 7*b*, and 7*c*.

In this case, the effective emission areas of the organic EL elements 20B, 20G, and 20R, associated with the setting of the first, second, and third film-formation regions 7*a*, 7*b*, and 7*c*, may be different.

Currently, a light-emitting layer formed by application, which is mainly used for polymer light-emitting-layer forming materials, tends to have a shorter emission life than one formed by evaporation, which is used for low-molecular-weight light-emitting-layer forming materials. In addition, a light-emitting layer having a longer emission peak wavelength tends to have a longer emission life.

On the other hand, the emission life depends on the current flowing through the light-emitting layer, and the luminance depends on the current and the emission area. In view of achieving a balance in emission life between different light-emitting layers while ensuring stable luminance for each emission color, evaporation, which is less susceptible to surface irregularities and provides superior coverage, is used to form light-emitting layers with desired thickness in the regions where the base layer has the highest surface irregularity, namely, the first film-formation regions 7*a*. This avoids variations in luminance and a decrease in emission life due to local concentration of current due to variations in thickness. Of the red (R), green (G), and blue (B) light-emitting layers 26*r*, 26*g*, and 26*b*, the blue light-emitting layer 26*b*, which has the shortest emission peak wavelength, is preferably formed by evaporation.

As for the light-emitting layers 26*r* (red) and the light-emitting layers 26*g* (green), which are formed by application, the light-emitting layers 26*g* may have a shorter emission life. It is therefore preferable that the third film-formation regions 7*c*, where the light-emitting layers 26*r* are formed, have a smaller planar area than the second film-formation regions 7*b*, where the light-emitting layers 26*g* are formed. In other words, it is preferable to form light-emitting layers having a shorter emission life in film-formation regions having a larger planar area. Reducing the current flowing through the light-emitting layers having a shorter emission life reduces the difference in emission life between the emission colors.

The above is summarized as follows:

(1) the blue light-emitting layer 26*b*, which has the shortest emission peak wavelength, is formed by evaporation in the regions where the base layer has a higher surface irregularity, namely, the first film-formation regions 7*a;*

(2) the light-emitting layers 26*g* and 26*r*, which have longer emission peak wavelengths than the light-emitting layer 26*b*, are formed by application (droplet ejection) in the second and third film-formation regions 7*b* and 7*c*, respectively, which are defined by the partitioning portion 19 so as to have a higher flatness than the first film-formation regions 7*a*; and (3) the planar areas of the first, second, and third film-formation regions 7*a*, 7*b*, and 7*c*, namely, the emission areas of the organic EL elements 20B, 20G, and 20R, are set so as to achieve a balance between the emission colors in terms of the luminances and emission lives of the light-emitting layers 26*b*, 26*g*, and 26*r*.

In the second to fourth examples below, application and evaporation are used in combination according to the same technical idea.

Second Example

Figure 20:
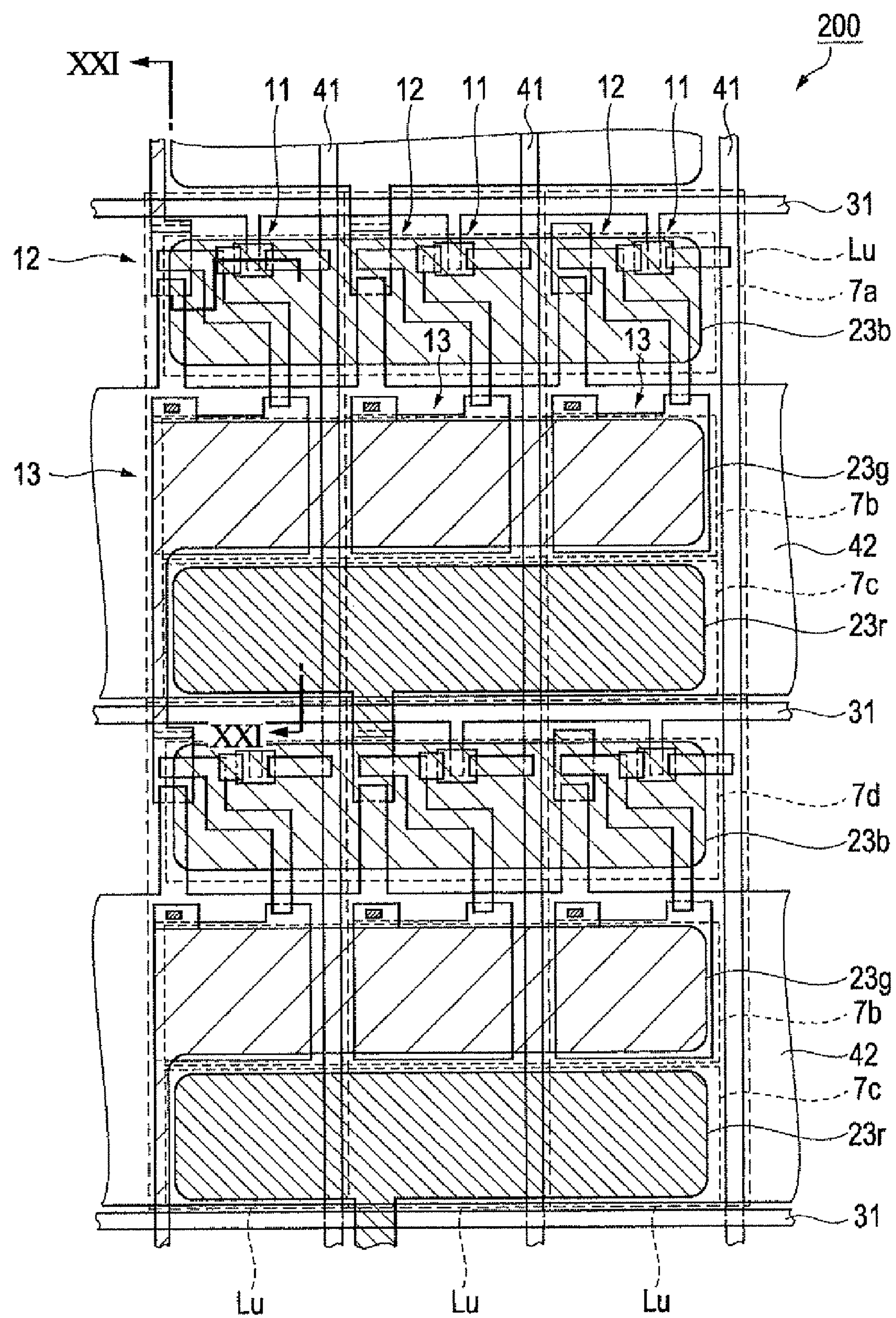
FIG. 20 is a schematic plan view showing the arrangement of emission units and emission control units in an organic EL device serving as a second example of the third embodiment.
Figure 21:
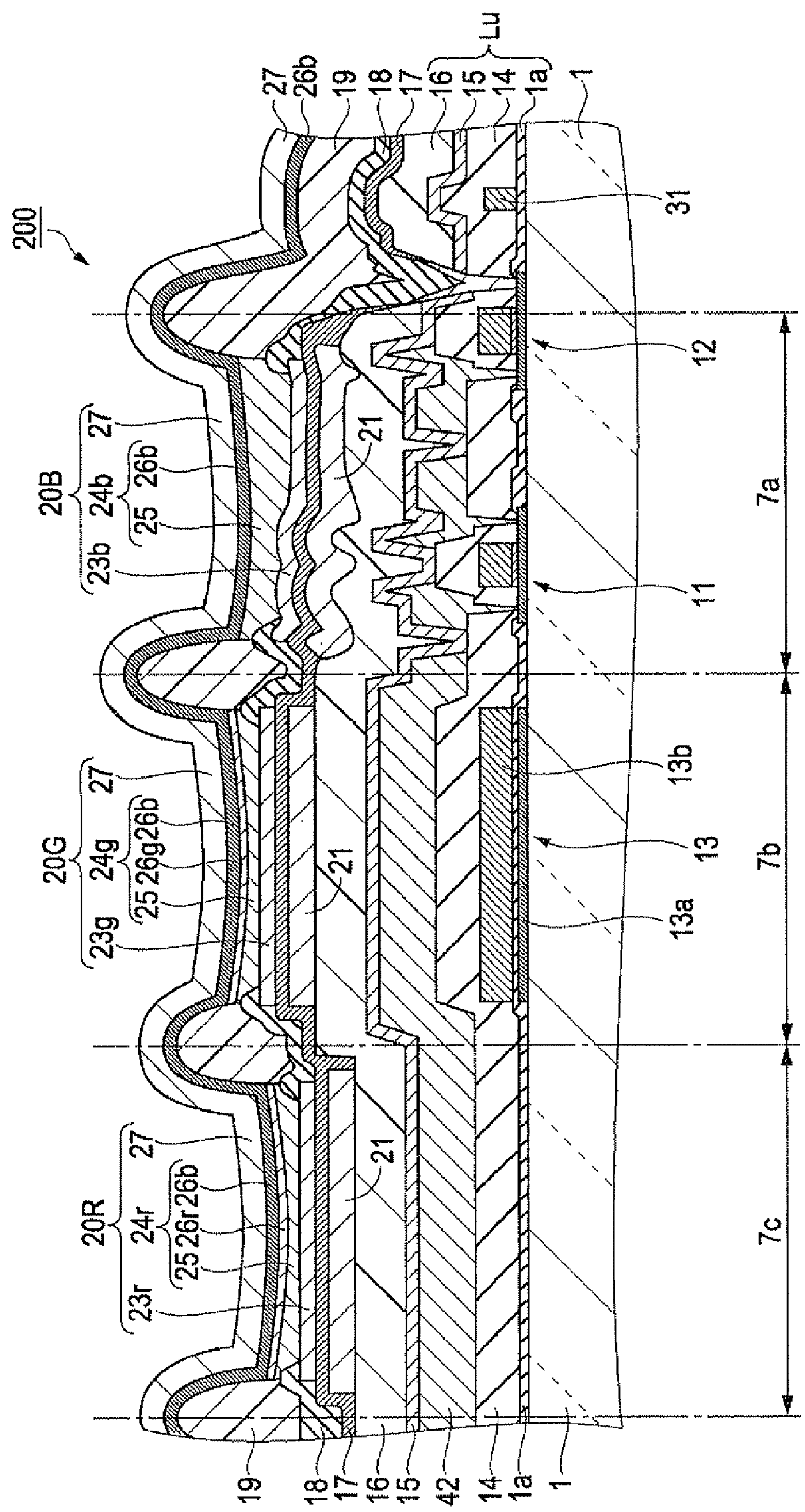
FIG. 21 is a schematic sectional view taken along line XXI-XXI of FIG. 20.

Next, the organic EL device serving as the second example and the method for producing the organic EL device will be described with reference to FIGS. 20 and 21. FIG. 20 is a schematic plan view showing the arrangement of emission units and emission control units in the organic EL device serving as the second example. FIG. 21 is a schematic sectional view taken along line XXI-XXI of FIG. 20. The same portions as those of the organic EL device 100 serving as the first example are denoted by the same reference numerals, and a detailed description thereof will be omitted.

Referring to FIG. 20, an organic EL device 200 serving as the second example has emission control units Lu in regions defined by scan lines 31 and data lines 41 arranged in a grid pattern and insulated from each other. The emission control units Lu, as in the organic EL device 100 serving as the first example, include TFTs 11 and 12, hold capacitors 13, and wiring lines connected thereto.

Each region extending over three emission control units Lu adjacent along the scan lines 31 is separated into, from top to bottom, a first film-formation region 7*a*, a second film-formation region 7*b*, and a third film-formation region 7*c*. An organic EL element 20B including a pixel electrode 23*b* is disposed in the first film-formation region 7*a*. An organic EL element 20G including a pixel electrode 23*g* is disposed in the second film-formation region 7*b*. An organic EL element 20R including a pixel electrode 23*r* is disposed in the third film-formation region 7*c*.

The pixel electrodes 23b, 23g, and 23r are electrically connected to the drive TFTs 12 in the same manner as in the first example.

In the second example, the hold capacitors 13 of the emission control units Lu for drive control of the organic EL elements 20B, 20G, and 20R are disposed in the second film-formation region 7b. In other words, the base layer has three hold capacitors 13 in the second film-formation region 7b.

In addition, a power line 42 is disposed over the second and third film-formation regions 7b and 7c so as to extend across the emission control units Lu arranged along the scan lines 31. That is, the second example differs from the first example in the positions of the hold capacitors 13 and the power line 42 relative to the organic EL elements 20B, 20G, and 20R.

Specifically, as shown in FIG. 21, the base layer has the TFTs 11 and 12 in the first film-formation region 7a, the hold capacitors 13 in the second film-formation region 7b, and the power line 42 in the second and third film-formation regions 7b and 7c. Accordingly, the base layer has the highest surface irregularity in the first film-formation region 7a. On the other hand, the base layer has relatively small surface steps in the second film-formation regions 7b because, despite the presence of the hold capacitors 13, they are constituted by a pair of electrodes 13a and 13b disposed opposite each other with the gate insulating film 1a, serving as a dielectric layer, therebetween. The base layer has the highest flatness in the third film-formation region 7c because the gate insulating film 1a, the interlayer insulating film 14, the power line 42, the protective film 15, and the planarizing layer 16, which have substantially uniform thickness, are sequentially stacked on the element substrate 1.

As in the first example, light-emitting layers 26g and 26r are formed in the second and third film-formation regions 7b and 7c, respectively, by application (droplet ejection), whereas a light-emitting layer 26b is formed in the first film-formation region 7a by evaporation.

Although the first, second, and third film-formation regions 7a, 7b, and 7c have nearly the same planar area, they may actually be set to various sizes. It is therefore necessary to ensure that the hold capacitors 13 and the power line 42 have desired electrical characteristics (such as capacitance and resistance). In this respect, the organic EL device 200 serving as the second example allows for a higher design flexibility for ensuring the desired electrical characteristics than the organic EL device 100 serving as the first example because it has a larger planar area where the hold capacitors 13 and the power line 42 are disposed. In other words, the organic EL device 200 allows the organic EL elements 20B, 20G, and 20R to emit light with a more stable luminance.

Although the organic EL device 200 has a larger planar area where the hold capacitors 13 and the power line 42 are disposed, it can be produced by the method for producing the organic EL device 100 because the types of components and the manner in which they are stacked on the element substrate 1 are the same as in the first example. This also applies to the third and fourth examples below.

Third Example

Figure 22:
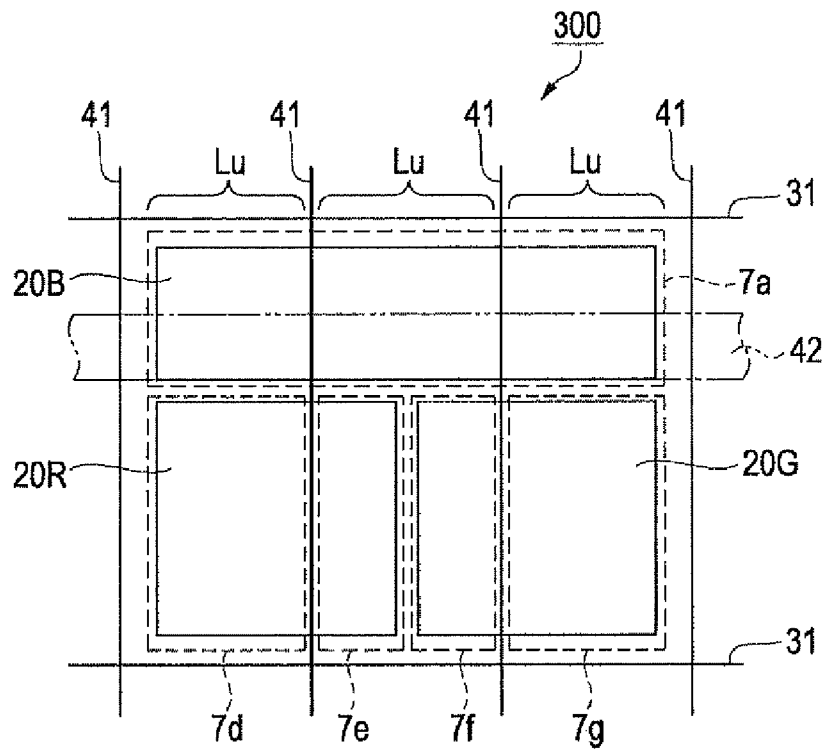
FIG. 22 is a schematic plan view showing the arrangement of emission units and emission control units in an organic EL device serving as a third example of the third embodiment.
Figure 23:
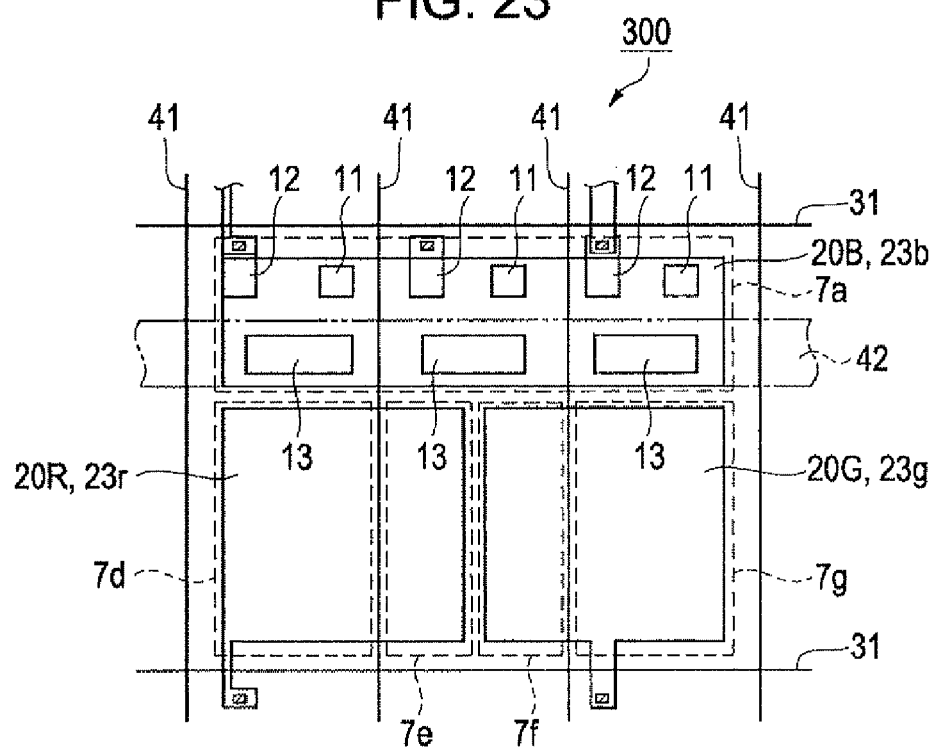
FIG. 23 is a schematic plan view showing the arrangement of components of drive circuit sections in the emission control units and film-formation regions in the third example of the third embodiment.

Next, the organic EL device serving as the third example and the method for producing the organic EL device will be described with reference to FIGS. 22 and 23. FIG. 22 is a schematic plan view showing the arrangement of emission units and emission control units in the organic EL device serving as the third example. FIG. 23 is a schematic plan view showing the arrangement of components of drive circuit sections in the emission control units and film-formation regions in the third example. The same portions as those of the organic EL device 100 serving as the first example are denoted by the same reference numerals, and a detailed description thereof will be omitted. Of the components of the drive circuit sections, only the main components, namely, the TFTs 11 and 12, the hold capacitors 13, and the power lines 42, are shown in FIG. 23, and wiring lines connected thereto are omitted.

Referring to FIG. 22, an organic EL device 300 serving as the third example has emission control units Lu in regions defined by scan lines 31 and data lines 41 arranged in a grid pattern and insulated from each other. The emission control units Lu, as in the organic EL device 100 serving as the first example, include TFTs 11 and 12, hold capacitors 13, and wiring lines connected thereto.

As in the first example, each region extending over three emission control units Lu adjacent along the scan lines 31 has a first film-formation region 7a on the topmost side in FIG. 23. The region other than the first film-formation region 7a is separated along the scan lines 31 into four regions, namely, a fourth film-formation region 7d, a fifth film-formation region 7e, a sixth film-formation region 7f, and a seventh film-formation region 7g, such that they do not cross the data lines 41.

An organic EL element 20B is disposed in the first film-formation region 7a. An organic EL element 20R is disposed over the fourth and fifth film-formation regions 7d and 7e. An organic EL element 20G is disposed over the sixth and seventh film-formation regions 7f and 7g.

That is, the third example differs from the first example in that each region including three adjacent emission control units Lu is separated into a total of five film-formation regions 7a, 7d, 7e, 7f, and 7g and also differs in the relative positions of the organic EL elements 20G and 20R.

Specifically, as shown in FIG. 23, the base layer has the TFTs 11 and 12, the hold capacitors 13, the pixel electrode 23b, the data lines 41, and the power line 42 in the first film-formation region 7a. On the other hand, the base layer does not have the wiring lines such as the scan lines 31, the data lines 41, and the power line 42 in the fourth to seventh film-formation regions 7d to 7g. To ensure flatness, preferably, the signal lines, which are disposed on the element substrate 1 so as to cross and be insulated from each other, are not disposed in the fourth to seventh film-formation regions 7d to 7g.

A light-emitting layer 26r is formed in the fourth and fifth film-formation regions 7d and 7e by applying a liquid 70R containing a red light-emitting-layer forming material by application (droplet ejection). Similarly, a light-emitting layer 26g is formed in the sixth and seventh film-formation regions 7f and 7g by applying a liquid 70G containing a green light-emitting-layer forming material by application (droplet ejection). A light-emitting layer 26b is formed in the first film-formation region 7a by evaporation such that it simultaneously covers the light-emitting layers 26g and 26r.

In the organic EL device 300 serving as the third example, the base layer has no wiring lines in the fourth to seventh film-formation regions 7d to 7g, where the light-emitting layers 26g and 26r are formed by application. Accordingly, the base layer has a higher surface flatness than those in the first and second examples. This further reduces variations in the thickness of the light-emitting layers 26g and 26r.

As described in the first example, the effective emission areas of the organic EL elements 20B, 20G, and 20R, associated with the setting of the film-formation regions 7a, 7d, 7e, 7f, and 7g, may be different.

Fourth Example

Figure 24:
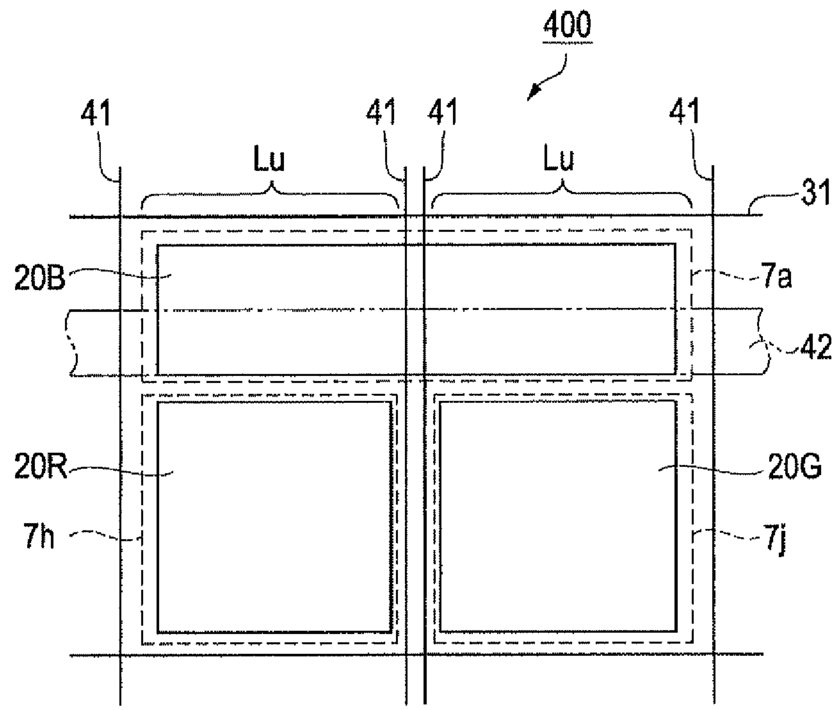
FIG. 24 is a schematic plan view showing the arrangement of emission units and emission control units in an organic EL device serving as a fourth example of the third embodiment.
Figure 25:
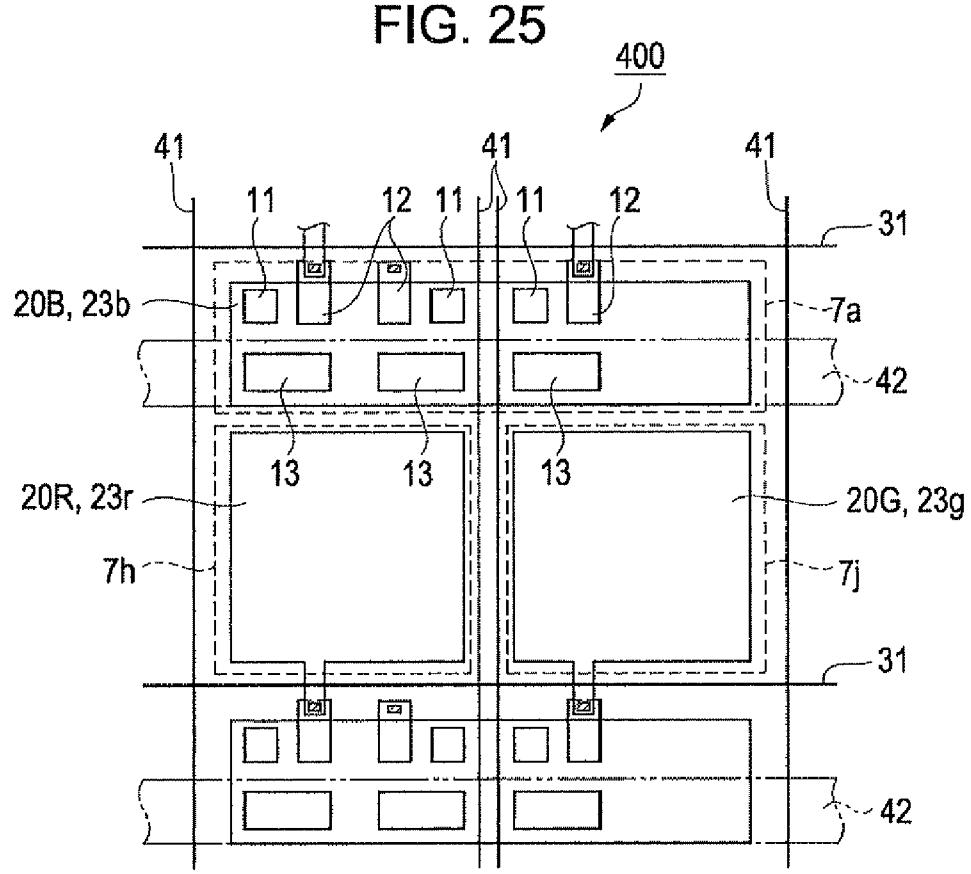
FIG. 25 is a schematic plan view showing the arrangement of components of drive circuit sections in the emission control units and film-formation regions in the fourth example of the third embodiment.

Next, the organic EL device serving as the fourth example and the method for producing the organic EL device will be described with reference to FIGS. 24 and 25. FIG. 24 is a schematic plan view showing the arrangement of emission units and emission control units in the organic EL device serving as the fourth example. FIG. 25 is a schematic plan view showing the arrangement of components of drive circuit sections in the emission control units and film-formation regions in the fourth example. The same portions as those of the organic EL device 100 serving as the first example are denoted by the same reference numerals, and a detailed description thereof will be omitted. Of the components of the drive circuit sections, only the main components, namely, the TFTs 11 and 12, the hold capacitors 13, and the power lines 42, are shown in FIG. 25, and wiring lines connected thereto are omitted.

Referring to FIG. 24, an organic EL device 400 serving as the fourth example differs from the organic EL device 300 serving as the third example in the arrangement of the data lines 41 and the components of the drive circuit sections in the adjacent emission control units Lu.

Specifically, two data lines 41 are disposed so as to extend side by side, and two emission control units Lu are arranged on both sides of the two data lines 41 along the scan lines 31.

Each region including the two emission control units Lu is separated along the scan lines 31 into three film-formation regions, namely, a first film-formation region 7*a* extending across the two emission control units Lu along the scan lines 31, an eighth film-formation region 7*h* in the region where one emission control unit Lu (left in FIG. 24) is disposed, and a ninth film-formation region 7*j* in the region where the other emission control unit Lu (right in FIG. 24) is disposed.

An organic EL element 20B is disposed in the first film-formation region 7*a*. An organic EL element 20R is disposed in the eighth film-formation region 7*h*. An organic EL element 20G is disposed in the ninth film-formation region 7*j*. As in the first example, the organic EL element 20B includes a light-emitting layer 26*b* formed by evaporation, whereas the organic EL elements 20G and 20R include light-emitting layers 26*g* and 26*r*, respectively, formed by application (droplet ejection).

Specifically, as shown in FIG. 25, one emission control unit Lu includes the components of the drive circuit sections (such as the TFTs 11 and 12, the hold capacitors 13, and the power line 42) for drive control of the two organic EL elements 20B and 20R. The TFTs 11 and 12 and the hold capacitors 13 are symmetrical with respect to an axis extending in a direction along the data lines 41.

The other emission control unit Lu includes the components of the drive circuit section for drive control of the organic EL element 20G.

The power line 42 extends along the scan lines 31 so as to cover the three hold capacitors 13 disposed in the first film-formation region 7*a*.

The pixel electrode 23*b* of the organic EL element 20B is connected to one of the TFTs 12 (drain) of one emission control unit Lu, whereas the pixel electrode 23*r* of the organic EL element 20R is connected to the other TFT 12 (drain) of the emission control unit Lu. The pixel electrode 23*g* of the organic EL element 20G is connected to a TFT 12 (drain) of the other emission control unit Lu.

In the organic EL device 400 serving as the fourth example, the light-emitting layers 26*r* and 26*g* are formed in the eighth and ninth film-formation regions 7*h* and 7*j*, respectively, which are separated so as not to include the data lines 41, by application (droplet ejection). In the fourth example, the ejection (application) of liquids 70G and 70R containing light-emitting-layer forming materials is not complicated because, unlike in the third example, the light-emitting layers 26*g* and 26*r* are not each separated into two regions. In addition, the liquids 70R and 70G can be relatively easily spread over the eighth and ninth film-formation regions 7*h* and 7*j*. This ensures that the base layer have high flatness, so that the light-emitting layers 26*g* and 26*r* can be formed with reduced variations in thickness.

In addition, the three film-formation regions 7*a*, 7*h*, and 7*j* may have nearly the same planar area, or at least one of them may have a different planar area. In particular, the sizes of the pixel electrodes 23*g* and 23*r*, that is, the emission areas of the organic EL elements 20G and 20R, can be relatively flexibly adjusted because the pixel electrodes 23*g* and 23*r* can be disposed without extending across the two data lines 41.

Figure 26:
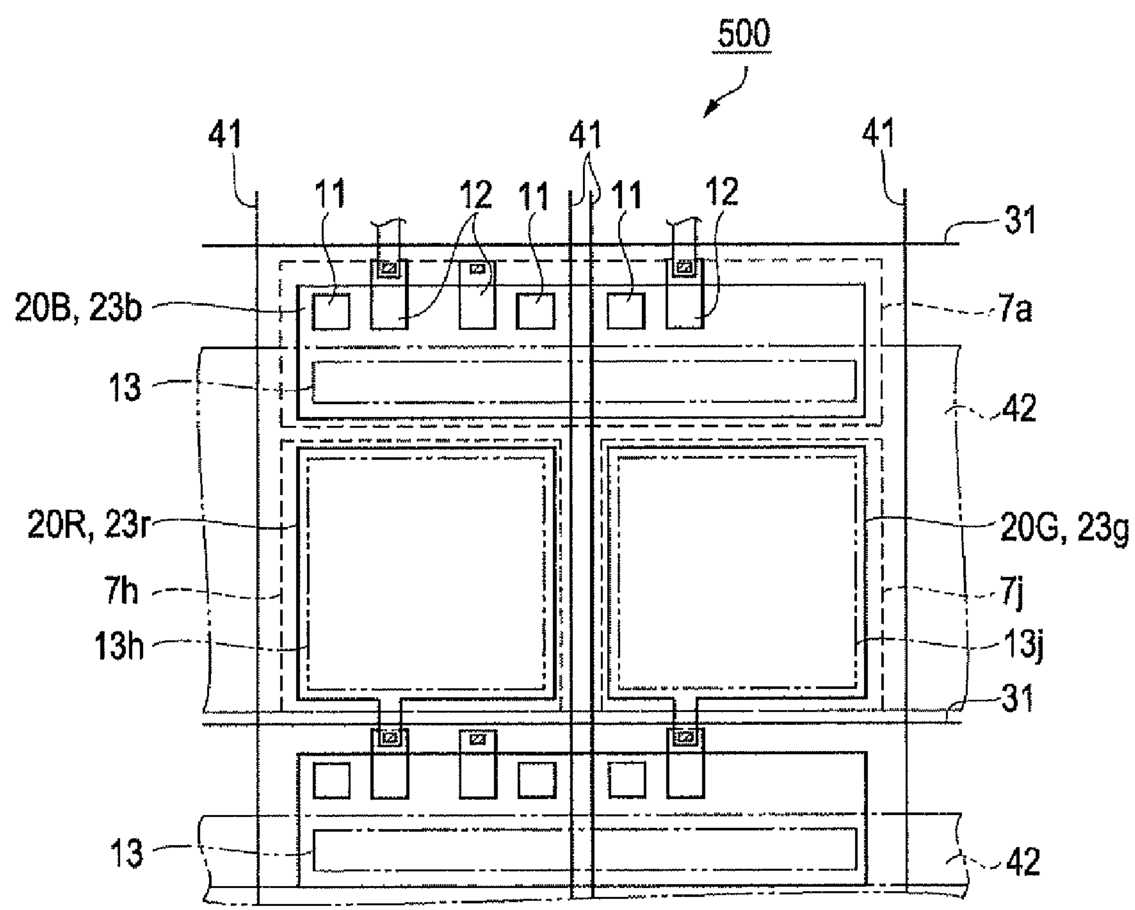
FIG. 26 is a schematic plan view showing the arrangement of drive circuit sections in a modification of the fourth example of the third embodiment.

The arrangement of the power line 42 and the hold capacitors 13 in the fourth example is not limited to the above arrangement. FIG. 26 is a schematic plan view showing the arrangement of the drive circuit sections in a modification of the fourth example.

Referring to FIG. 26, an organic EL device 500 serving as the modification differs from the organic EL device 400 serving as the fourth example in the arrangement of the power line 42 and the hold capacitors 13.

Specifically, the power line 42 is disposed so as to extend over the first, eight, and ninth film-formation regions 7*a*, 7*h*, and 7*j*. In the first film-formation region 7*a*, a hold capacitor 13 is disposed along the power line 42 so as to extend across the two adjacent data lines 41 and so as not to overlap the region where the TFTs 11 and 12 are disposed. In the eighth film-formation region 7*h*, a hold capacitor 13*h* having nearly the same planar area as the pixel electrode 23*r* is disposed at a position where it overlaps the pixel electrode 23*r*. Similarly, in the ninth film-formation region 7*j*, a hold capacitor 13*j* having nearly the same planar area as the pixel electrode 23*g* is disposed at a position where it overlaps the pixel electrode 23*g*.

The above arrangement of the power line 42 and the hold capacitors 13, 13*h*, and 13*j* allows the hold capacitors 13, 13*h*, and 13*j* to have the capacitances corresponding to the organic EL elements 208, 20G, and 20R. In other words, the above arrangement increases the design flexibility of the hold capacitors 13, 13*h*, and 13*j*.

Fourth Embodiment

Figure 27:
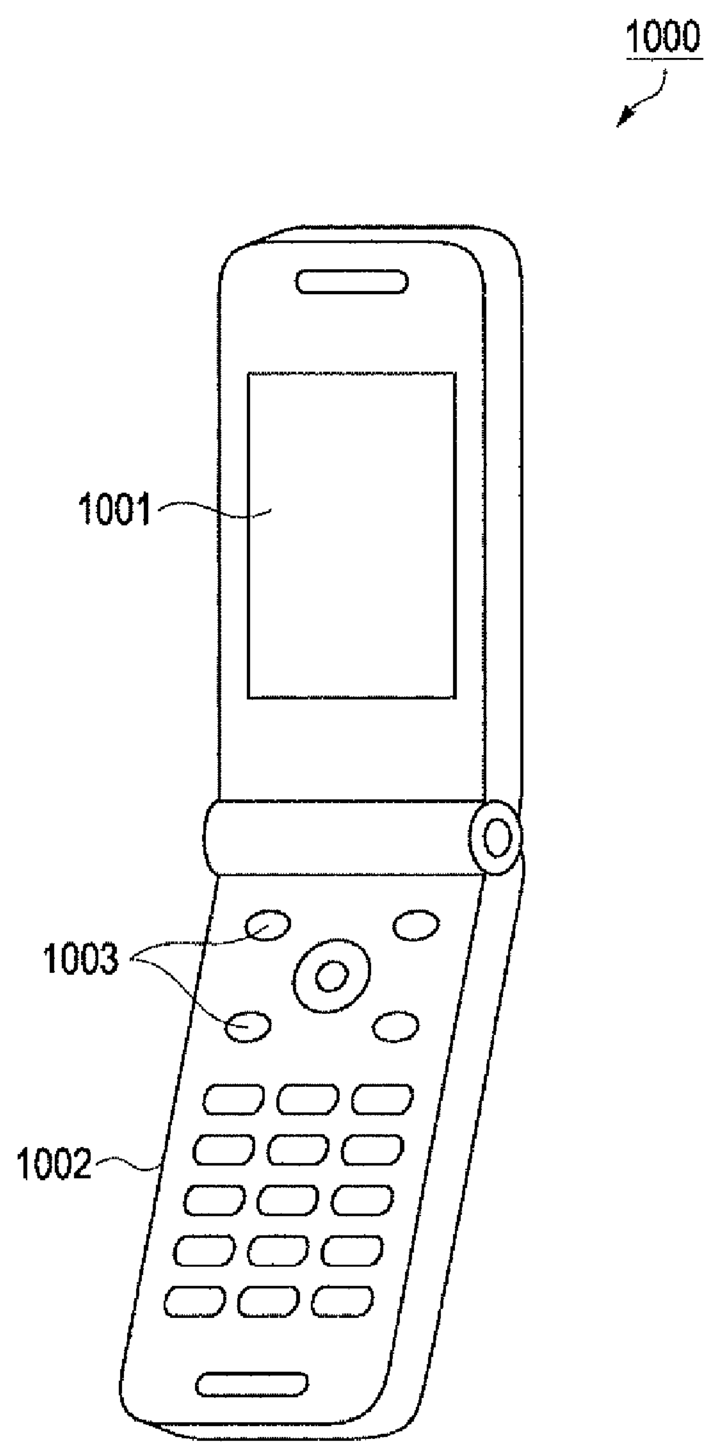
FIG. 27 is a perspective view of a cellular phone serving as an electronic apparatus.

Next, a cellular phone will be described as an example of an electronic apparatus according to a fourth embodiment of the invention. FIG. 27 is a perspective view of the cellular phone serving as an electronic apparatus.

Referring to FIG. 27, a cellular phone 1000 according to this embodiment includes a main body 1002 having operating buttons 1003 and a display unit 1001 attached to the main body 1002 so that they can be folded about a hinge.

The display unit 1001 includes one of the organic EL devices 10, 40, 100, 200, 300, 400, and 500 according to the above embodiments.

Accordingly, the cellular phone 1000 provides a beautiful full-color display with reduced variations in luminance due to variations in the thickness of the light-emitting layers 26*b*, 26*r*, and 26*r*.

The type of electronic apparatus including one of the organic EL devices 10, 40, 100, 200, 300, 400, and 500 is not limited to the cellular phone 1000; other examples include electronic apparatuses having display units, such as personal computers, portable information terminals, car navigation systems, and image viewers.

In addition to the above embodiments, various modifications are possible; some of them will be described below.

First Modification

In the organic EL devices 10 and 40 of the first and second embodiments, each region including three adjacent emission control units Lu does not necessarily have to be separated into three regions. For example, each region may be separated into the first film-formation region 7*a* including the semiconductor elements (TFTs 11 and 12), thus having the greatest number of irregularities, and at least one other region. An organic EL element that emits monochromatic light is disposed in each film-formation region. This suppresses variations in the thickness of the functional layers due to steps (level or state of surface irregularities) over the drive circuit sections on the substrate, thus reducing variations in the luminance of monochromatic light.

Second Modification

In the organic EL devices 10 and 40 of the first and second embodiments, the first, second, third, and fourth film-formation regions 7*a*, 7*b*, 7*c*, and 7*d* do not necessarily have to have nearly the same planar areas. For example, the arrangement, size, and shape of the first, second, third, and fourth film-formation regions 7*a*, 7*b*, 7*c*, and 7*d* may be determined in view of the desired electrical characteristics of the TFTs 11 and 12 and the hold capacitors 13, and at least one or each of the film-formation regions 7*a*, 7*b*, 7*c*, and 7*d* may have a different planar area. This allows adjustment of the emission areas depending on the emission characteristics (including luminance and chromaticity) of the functional layers 24*b*, 24*g*, and 24*r* that emit light of different colors.

Third Modification

In the second modification, a functional layer having a shorter emission life than the other functional layers is preferably disposed in the film-formation region having the largest planar area. Specifically, the blue functional layer 24*b* is preferably disposed because the functional-layer forming material that emits blue light has a shorter emission life than the other functional-layer forming materials that emit red and green. The decrease in emission life is proportional to the current flowing through the functional layer. Hence, to achieve nearly the same luminance for each emission color, the blue functional layer 24*b*, disposed in the film-formation region having the largest planar area, may be supplied with a smaller current than the other functional layers 24*g* and 24*r*. This extends the emission life of the organic EL device 10 or 40 itself.

In addition, a functional layer having a longer emission life than the other functional layers is preferably disposed in the film-formation region having the smallest planar area. Specifically, the red or green functional layer 24*r* or 24*g* is preferably disposed because the functional-layer forming materials that emit red and green light have longer emission lives than the functional-layer forming material that emits blue light. In particular, green has a higher visibility than red. The decrease in emission life is proportional to the current flowing through the functional layer. Hence, to achieve nearly the same luminance for each emission color, the green functional layer 24*g* is preferably disposed in the film-formation region having the smallest planar area. Although the green functional layer 24*g* must be supplied with a larger current than the other functional layers 24*b* and 24*r*, the current supplied to the green functional layer 24*g* can be used as a baseline to reduce the currents flowing through the other functional layers 24*b* and 24*r* because green has a higher visibility. This extends the emission life of the organic EL device 10 or 40 itself.

Fourth Modification

In the method for producing the organic EL device 10 according to the first embodiment, if at least one of the first, second, and third film-formation regions 7*a*, 7*b*, and 7*c* has a different planar area, the shapes of the films formed in the light-emitting-layer forming step may be unstable due to the difference in drying speed because a film having a smaller planar area tends to dry more quickly after application. It is therefore desirable to apply the liquids 70B, 70G, and 70R in order of decreasing planar area. This alleviates the difference in drying speed between the first, second, and third film-formation regions 7*a*, 7*b*, and 7*c*, so that the light-emitting layers 26*b*, 26*g*, and 26*r* can be formed with stable film shapes.

Fifth Modification

In the method for producing the organic EL device 10 according to the first embodiment, if the different types of liquids 70B, 70G, and 70R are separately applied into the first, second, and third film-formation regions 7*a*, 7*b*, and 7*c* in the light-emitting-layer forming step, a liquid applied later has a lower wettability over the film-formation regions. It is therefore desirable to apply the different types of liquids 70B, 70G, and 70R in order of increasing wettability over the film-formation regions. This reliably ensures the wettability of the liquids 70B, 70G, and 70R over the film-formation regions so that they can be evenly applied.

Sixth Modification

In the method for producing the organic EL device 10 according to the first embodiment, of the liquids 70B, 70G, and 70R containing different light-emitting-layer forming materials, for example, a liquid containing a light-emitting-layer forming material that tends to be deactivated when exposed to, for example, moisture, oxygen, or heat is preferably applied last to improve yield.

Seventh Modification

In the method for producing the organic EL device 10 according to the first embodiment, the method for forming the functional layers in the functional-layer forming step is not limited to application and solidification of liquids containing functional materials. For example, the functional layers may be low-molecular-weight or polymer organic thin films formed by evaporation; the effects and advantages of the first embodiment can also be achieved by evaporation.

Eighth Modification

The type of electronic apparatus, according to the fourth embodiment, including one of the organic EL devices 10, 40, 100, 200, 300, 400, and 500 according to the above embodiments is not limited to the cellular phone 1000 and may be either an electronic apparatus capable of full-color emission (display) or an electronic apparatus capable of monochromatic emission. For example, an electronic apparatus that emits monochromatic light may be used as an illumination apparatus.

Ninth Modification

Figure 28:
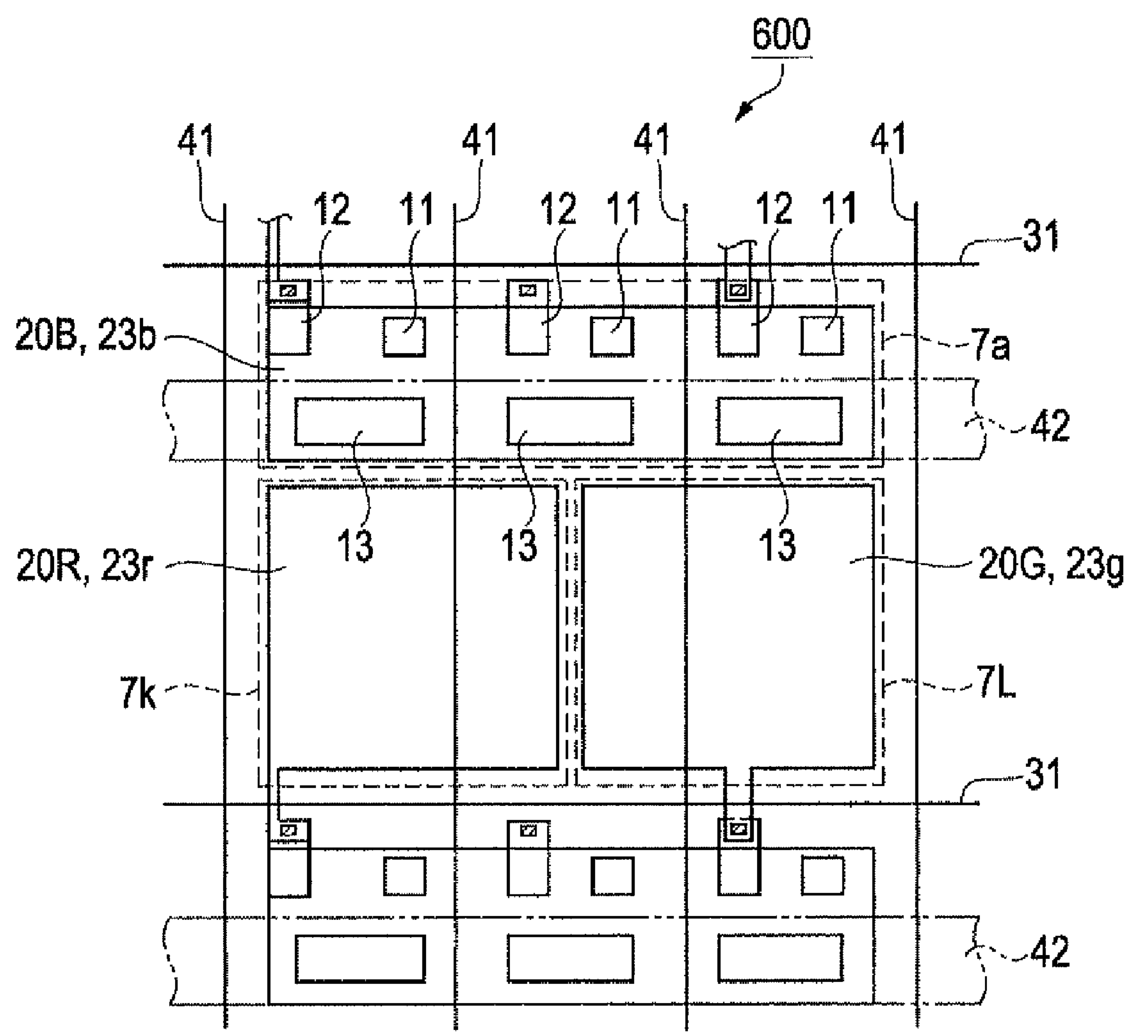
FIG. 28 is a schematic plan view showing the arrangement of components of drive circuit sections in emission control units and film-formation regions in a modification of the third example of the third embodiment.

In the third example of the third embodiment, the manner in which the film-formation regions are separated on the base layer is not limited to the manner described above. FIG. 28 is a schematic plan view showing the relative positions of the components of the drive circuit sections in the emission control units and the film-formation regions in the ninth modification. For example, as shown in FIG. 28, an organic EL device 600 serving as the ninth modification has a first film-formation region 7*a* extending across three emission control units Lu arranged along the scan lines 31, a tenth film-formation region 7*k* extending across the data line 41 between two emission control units Lu, and an eleventh film-formation region 7L extending across the data line 41 between two emission control units Lu. The light-emitting layer 26*b* is formed in the first film-formation region 7*a* by evaporation because it provides superior coverage. The light-emitting layers 26*r* and 26*g*, on the other hand, are formed in the tenth and eleventh film-formation regions 7*k* and 7L, respectively, by application (droplet ejection).

Although the tenth and eleventh film-formation regions 7*k* and 7L extend across the data lines 41, the regions where the light-emitting layers 26*g* and 26*r* are formed have moderate flatness because they are not divided, unlike in the third example. Accordingly, the light-emitting layers 26*r* and 26*g* can be formed with reduced variations in thickness.

Tenth Modification

The emission colors of the organic EL devices 10, 40, 100, 200, 300, 400, and 500 according to the above embodiments are not limited to the above three emission colors, namely, red (R), green (G), and blue (B); they may include organic EL devices that emit light of other colors. In other words, the number of film-formation regions where light-emitting layers are formed in each display unit is not limited to three. Thus, a higher color reproducibility can be achieved.

Eleventh Modification

In the method for producing the organic EL device 100 according to the third embodiment, if the second and third film-formation regions 7*b* and 7*c* have different planar areas, the shapes of the films formed in the light-emitting-layer forming step may be unstable due to the difference in drying speed because a film having a smaller planar area tends to dry more quickly after application. It is therefore desirable to apply the liquids 70G and 70R in order of decreasing planar area. This alleviates the difference in drying speed between the second and third film-formation regions 7*b* and 7*c*, so that the light-emitting layers 26*g* and 26*r* can be formed with stable film shapes.

Twelfth Modification

In the method for producing the organic EL device 100 according to the third embodiment, if the different types of liquids 70G and 70R are applied to the second and third film-formation regions 7*b* and 7*c* in the light-emitting-layer forming step, a liquid applied later has a lower wettability over the film-formation regions. It is therefore desirable to apply the different types of liquids 70G and 70R in order of increasing wettability over the film-formation regions. This reliably ensures the wettability of the liquids 70G and 70R over the film-formation regions so that they can be evenly applied.

Thirteenth Modification

In the method for producing the organic EL device 100 according to the third embodiment, of the liquids 70G and 70R containing different light-emitting-layer forming materials, for example, a liquid containing a light-emitting-layer forming material that tends to be deactivated when exposed to, for example, moisture, oxygen, or heat is preferably applied last to improve yield.

The entire disclosure of Japanese Patent Application Nos: 2008-268316, filed Oct. 17, 2008, and 2009-170879, filed Jul. 22, 2009 are expressly incorporated by reference herein.

What is claimed is:

1. An organic electroluminescent (EL) device comprising:
a base layer including a substrate;
a partitioning portion disposed on the base layer and defining first and second film-formation regions adjacent to each other;
a first organic EL element disposed on the base layer at a position overlapping the first film-formation region in plan view;
a second organic EL element disposed on the base layer at a position overlapping the second film-formation region in plan view;
a first drive circuit section disposed in the base layer to control driving of the first organic EL element; and
a second drive circuit section disposed in the base layer to control driving of the second organic EL element;
wherein at least part of the first drive circuit section and at least part of the second drive circuit section overlap the first film-formation region in plan view.

2. The organic EL device according to claim 1, wherein
the first and second drive circuit sections each include a thin-film transistor and a hold capacitor;
the thin-film transistors of the first and second drive circuit sections are disposed at positions overlapping the first film-formation region in plan view; and
the hold capacitors of the first and second drive circuit sections are disposed at positions overlapping the second film-formation region in plan view.

3. The organic EL device according to claim 1, wherein
the first and second drive circuit sections each include a thin-film transistor and a hold capacitor; and
the thin-film transistors and the hold capacitors of the first and second drive circuit sections are disposed at positions overlapping the first film-formation region in plan view.

4. The organic EL device according to claim 1, wherein the first organic EL element includes a first light-emitting layer formed by application and the second organic EL element includes a second light-emitting layer formed by application.

5. The organic EL device according to claim 4, wherein the base layer has a higher surface irregularity in a region overlapping the first film-formation region in plan view than in a region overlapping the second film-formation region in plan view, and the first light-emitting layer has a longer emission life than the second light-emitting layer.

6. The organic EL device according to claim 1, wherein
the first organic EL element can emit light of a first color and the second organic EL element can emit light of a second color different from the first color; and the first organic EL element includes a first light-emitting layer and the second organic EL element includes a second light-emitting layer, the first and second light-emitting layers being formed by different methods.

7. The organic EL device according to claim 6, wherein the base layer has a higher surface irregularity in a region overlapping the first film-formation region in plan view than in a region overlapping the second film-formation region in plan view.

8. The organic EL device according to claim 6, wherein a layer of the same material as the first light-emitting layer is formed on the second light-emitting layer by the same process as the first light-emitting layer.

9. The organic EL device according to claim 6, wherein the partitioning portion further defines a third film-formation region adjacent to the first and second film-formation regions;

the organic EL device further comprises:

a third organic EL element disposed on the base layer at a position overlapping the third film-formation region in plan view and capable of emitting light of a third color different from the first and second colors;

a third drive circuit section disposed in the base layer to control driving of the third organic EL element; and first and second data lines disposed between the second and third film-formation regions so as to extend across the first film-formation region in plan view;

the third light-emitting layer of the third organic EL element is formed by a method different from the method for forming the first light-emitting layer of the first organic EL element;

at least part of the third drive circuit section overlaps the first film-formation region in plan view;

the first data line is electrically connected to one of the first, second, and third drive circuit sections; and the second data line is electrically connected to one of the first, second, and third drive circuit sections excluding the drive circuit section electrically connected to the first data line.

10. The organic EL device according to claim 9, wherein the first, second, and third drive circuit sections each include a thin-film transistor and a hold capacitor; and the thin-film transistors and the hold capacitors of the first, second, and third drive circuit sections are disposed at positions overlapping the first film-formation region in plan view.

11. The organic EL device according to claim 9, wherein the first, second, and third drive circuit sections each include a thin-film transistor and a hold capacitor;

the thin-film transistors of the first, second, and third drive circuit sections are disposed at positions overlapping the first film-formation region in plan view;

the hold capacitor of the first drive circuit section is disposed at a position overlapping the first film-formation region in plan view;

the hold capacitor of the second drive circuit section is disposed at a position overlapping the second film-formation region in plan view; and the hold capacitor of the third drive circuit section is disposed at a position overlapping the third film-formation region in plan view.

12. The organic EL device according to claim 6, wherein the first light-emitting layer of the first organic EL element is formed by evaporation or spin coating, and the second light-emitting layer of the second organic EL element is formed by droplet ejection.

13. An EL device comprising:

a first hold capacitor that hold a first pixel signal;

a first thin-film transistor having a first gate electrode supplied with the first pixel signal held by the first hold capacitor;

a first organic EL element disposed in a first film-formation region and electrically coupled to the first thin-film transistor, the first organic EL element being able to emit light of a first color;

a second hold capacitor that hold a second pixel signal;

a second thin-film transistor having a second gate electrode supplied with the second pixel signal held by the second hold capacitor;

a second organic EL element disposed in a second film-formation region and electrically coupled to the second thin-film transistor, the second organic EL element being able to emit light of a second color different from the first color, the first thin-film transistor and the second thin-film transistor being disposed in the first film-formation region.

14. The organic EL device according to claim 13,

The first hold capacitor and second hold capacitor being disposed in the first film-formation region.

15. The organic EL device according to claim 13,

The first hold capacitor and second hold capacitor being disposed in the second film-formation region.

16. An electronic apparatus comprising the organic EL device according to claim 1.

17. A method for producing an organic EL device including first and second organic EL elements above a substrate, the method comprising:

forming a first drive circuit section that controls driving of the first organic EL element and a second drive circuit section that controls driving of the second organic EL element above the substrate;

forming a partitioning portion on a base layer including the first and second drive circuit sections so as to define first and second film-formation regions adjacent to each other; and forming the first organic EL element on the base layer at a position overlapping the first film-formation region in plan view and forming the second organic EL element on the base layer at a position overlapping the second film-formation region in plan view;

wherein at least part of the first drive circuit section and at least part of the second drive circuit section are formed so as to overlap the first film-formation region in plan view.

18. The method for producing an organic EL device according to claim 17, wherein the first organic EL element can emit light of a first color and the second organic EL element can emit light of a second color different from the first color; and a first light-emitting layer of the first organic EL element and a second light-emitting layer of the second organic EL element are formed by different methods.

19. The method for producing an organic EL device according to claim 18, wherein the first light-emitting layer is formed by evaporation or spin coating, and the second light-emitting layer is formed by droplet ejection.

* * * * *